US008958002B2

(12) United States Patent
Choi et al.

(10) Patent No.: US 8,958,002 B2
(45) Date of Patent: Feb. 17, 2015

(54) IMAGE SENSORS

(71) Applicant: Samsung Electronics Co., Ltd., Suwon-si (KR)

(72) Inventors: Sang-Jun Choi, Yongin-si (KR); Yoon-Dong Park, Yongin-si (KR); Chris Hong, Los Angeles, CA (US); Dae-Lok Bae, Seoul (KR); Jung-Chak Ahn, Yongin-si (KR); Chang-Rok Moon, Seoul (KR); June-Mo Koo, Seoul (KR); Suk-Pil Kim, Yongin-si (KR); Hoon-Sang Oh, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/064,812

(22) Filed: Oct. 28, 2013

(65) Prior Publication Data
US 2014/0048853 A1    Feb. 20, 2014

Related U.S. Application Data

(63) Continuation of application No. 12/909,948, filed on Oct. 22, 2010, now Pat. No. 8,570,409.

(30) Foreign Application Priority Data

Oct. 22, 2009    (KR) .................. 10-2009-0100581

(51) Int. Cl.
| H04N 3/14 | (2006.01) |
| H04N 5/335 | (2011.01) |
| H01L 27/146 | (2006.01) |

(52) U.S. Cl.
CPC .... *H01L 27/14641* (2013.01); *H01L 27/14632* (2013.01); *H01L 27/14636* (2013.01); *H01L 27/14687* (2013.01); *H01L 27/14612* (2013.01); *H01L 27/14634* (2013.01)
USPC .......................................... 348/308; 257/448

(58) Field of Classification Search
CPC . H04N 3/155; H04N 5/3745; H04N 5/37457; H01L 27/146; H01L 27/14609; H01L 27/14632; H01L 27/14636; H01L 27/14638; H01L 27/14641
USPC .......... 348/294, 302, 305, 308; 257/440, 443, 257/444, 447, 448; 438/59, 60, 66, 74
See application file for complete search history.

(56) References Cited

U.S. PATENT DOCUMENTS

| 6,022,810 A | 2/2000 | Kusumi et al. |
| 6,927,432 B2 * | 8/2005 | Holm et al. .................. 257/290 |

(Continued)

FOREIGN PATENT DOCUMENTS

| JP | 2004055590 A | 2/2004 |
| JP | 2009290000 A | 12/2009 |

(Continued)

*Primary Examiner* — Aung S Moe
*Assistant Examiner* — Chriss Yoder, III
(74) *Attorney, Agent, or Firm* — Myers Bigel Sibley & Sajovec, P.A.

(57) ABSTRACT

An image sensor includes a first substrate including a driving element, a first insulation layer on the first substrate and on the driving element, a second substrate including a photoelectric conversion element, and a second insulation layer on the second substrate and on the photoelectric conversion element. A surface of the second insulation layer is on an upper surface of the first insulation layer. The image sensor includes a conductive connector penetrating the second insulation layer and a portion of the first insulation layer. Methods of forming image sensors are also disclosed.

16 Claims, 22 Drawing Sheets

(56) References Cited

U.S. PATENT DOCUMENTS

| | | |
|---|---|---|
| 8,098,312 B2 | 1/2012 | Matsuo et al. |
| 2009/0020842 A1* | 1/2009 | Shiau et al. .................... 257/459 |
| 2009/0224345 A1* | 9/2009 | Lee et al. ....................... 257/432 |
| 2009/0230287 A1 | 9/2009 | Anderson et al. |
| 2009/0275165 A1 | 11/2009 | Pourquier |
| 2009/0294814 A1* | 12/2009 | Assefa et al. .................. 257/292 |
| 2010/0238334 A1* | 9/2010 | Takahashi ..................... 348/305 |

FOREIGN PATENT DOCUMENTS

| | | |
|---|---|---|
| JP | 2011145281 A | 7/2011 |
| KR | 1020060108378 A | 10/2006 |
| KR | 1020070120255 A | 12/2007 |
| KR | 1020070120456 A | 12/2007 |
| WO | WO 2008/074688 A1 | 6/2008 |
| WO | WO 2009/117046 A1 | 9/2009 |

* cited by examiner

IMAGE SENSORS

CROSS-REFERENCE TO RELATED APPLICATIONS

This application is a continuation of U.S. application Ser. No. 12/909,948, filed Oct. 22, 2010 (now U.S. Pat. No. 8,570, 409), which claims priority under 35 USC §119 to Korean Patent Application No. 10-2009-0100581, filed Oct. 22, 2009, in the Korean Intellectual Property Office (KIPO), the disclosures of which are hereby incorporated herein in their entirety by reference.

BACKGROUND

1. Technical Field

The inventive concept relates to image sensors and methods of manufacturing image sensors. More particularly, the inventive concept relates to image sensors having highly integrated pixel arrays and methods of manufacturing image sensors having highly integrated pixel arrays.

2. Description of the Related Art

Complementary metal-oxide semiconductor (CMOS) image sensors are becoming more highly integrated. That is, they are being made smaller and/or to include more pixels. Each pixel of a typical CMOS image sensor includes a photodiode and associated transistors for converting charges generated in the photodiode into an electrical signal. As CMOS image sensors become more highly integrated, the horizontal area of the photodiode may be reduced. Therefore, the number of charges generated in the photodiode may be reduced and/or interference between neighboring pixels ("crosstalk") may increase, which can cause errors in the image data generated by the CMOS sensor.

SUMMARY

Some embodiments provide highly integrated image sensors and/or methods of manufacturing highly integrated image sensors.

According to some embodiments, an image sensor includes a first substrate, a first oxide layer, a second substrate, a second oxide layer and a connector. The first substrate includes a driving element. The first oxide layer is formed on the first substrate, where the first oxide layer covers the driving element. The second substrate includes a photoelectric conversion element. The second oxide layer is formed on the second substrate, where the second oxide layer covers the photoelectric conversion element and a surface of the second oxide layer is adhered to an upper surface of the first oxide layer. The connector penetrates the second substrate, the second oxide layer and a portion of the first oxide layer.

The driving element may include a reset transistor, a driving transistor and a selection transistor.

The photoelectric conversion element may include a photodiode.

The photoelectric conversion element may include a photodiode, a transfer transistor and a floating diffusion region.

The floating diffusion region may be provided under a surface of the second substrate between gate electrodes of the transfer transistors and be commonly used by more than two unit pixels.

A wiring may be provided on the second substrate to electrically connect at least two floating diffusion regions.

The connector may be electrically connected to the wiring.

The first substrate may include a logic region and a logic circuit may be provided on the logic region.

The connector may be provided for every four unit pixels.

In a method of manufacturing an image sensor according to some embodiments, a driving element is formed on a first substrate, a first oxide layer is formed on the first substrate, where the first oxide layer covers the driving element, a photoelectric conversion element is formed on a second substrate, a second oxide layer is formed on the second substrate, where the second oxide layer covers the photoelectric conversion element, the first substrate and the second substrate are adhered, and a connector penetrating the second substrate, the second oxide layer and a portion of the first oxide layer is formed.

The photoelectric conversion element may include a photodiode, a transfer transistor and a floating diffusion region.

The floating diffusion region may be formed under a surface of the second substrate between gate electrodes of the transfer transistors.

A wiring may be formed in the second oxide layer, where the wiring electrically connects at least two floating diffusion regions, a hole penetrating the wiring and a portion of the second oxide layer may be formed, and a sacrificial connector may be formed by depositing a sacrificial layer in the hole.

The connector may be formed by etching a portion of the second substrate to expose the sacrificial connector, removing the sacrificial layer in the sacrificial connector, forming a contact hole by etching the second oxide layer and a portion of the first oxide layer disposed under the sacrificial layer, and depositing a conductive material in the contact hole.

The sacrificial layer may include a polymer material having carbon.

The photoelectric conversion element may include a photodiode.

A surface of the second substrate may be polished after adhering the first substrate and the second substrate, where the surface corresponds to an adhesion surface of the second substrate.

A color filter and a lens may be formed on the polished surface of the second substrate.

A logic circuit may be formed on the first substrate.

The sacrificial layer may be removed by an ashing process.

An image sensor according to some further embodiments includes a first substrate including a driving element, a first insulation layer on the first substrate and on the driving element, a second substrate including a photoelectric conversion element, and a second insulation layer on the second substrate and on the photoelectric conversion element. A surface of the second insulation layer is on an upper surface of the first insulation layer. The image sensor further includes a conductive connector penetrating the second insulation layer and a portion of the first insulation layer.

The image sensor further includes a first wiring pattern between the first substrate and the first insulation layer, a second wiring pattern between the second substrate and the second insulation layer, and a floating diffusion region in the second substrate. The second wiring pattern may be conductively connected to the floating diffusion region, and the first wiring pattern may be conductively connected to the second wiring pattern by the conductive connector.

The driving element includes a reset transistor, a driving transistor and a selection transistor, and the photoelectric conversion element includes a photodiode, a transfer transistor and a floating diffusion region. The floating diffusion region may be conductively connected to a gate of the driving transistor by the conductive connector.

The floating diffusion region may be coupled to a source/drain region of the transfer transistor. In some embodiments, the floating diffusion region provides the source/drain region of the transfer transistor.

The floating diffusion region may be conductively connected to a source/drain region of the reset transistor by the conductive connector.

The image sensor may further include a first wiring pattern between the first substrate and the first insulation layer, and a second wiring pattern between the second substrate and the second insulation layer. The second wiring pattern may be conductively connected to the floating diffusion region, and the first wiring pattern may be conductively connected to the second wiring pattern by the conductive connector.

The image sensor may further include a second photodiode and a second transfer transistor in the second substrate. The floating diffusion region may be coupled to source/drain regions of the first transfer transistor and the second transfer transistor.

The floating diffusion region may provide source/drain regions of the first transfer transistor and the second transfer transistor. In some embodiments, the conductive connector may be coupled to source/drain regions of four transfer transistors.

Methods of manufacturing an image sensor according to some further embodiments include forming a driving element on a first substrate, forming a first insulation layer on the first substrate and on the driving element, forming a photoelectric conversion element on a second substrate, forming a second insulation layer on the second substrate and on the photoelectric conversion element, adhering the first substrate and the second substrate, and forming a conductive connector that penetrates the second insulation layer and a portion of the first insulation layer.

The methods may further include forming a first wiring pattern between the first substrate and the first insulation layer, a second wiring pattern between the second substrate and the second insulation layer, and a floating diffusion region in the second substrate. The second wiring pattern may be conductively connected to the floating diffusion region, and the first wiring pattern may be conductively connected to the second wiring pattern by the conductive connector.

The driving element may include a reset transistor, a driving transistor and a selection transistor, and the photoelectric conversion element may include a photodiode, a transfer transistor and a floating diffusion region. The floating diffusion region may be conductively connected to a gate of the driving transistor by the conductive connector. Furthermore, the floating diffusion region may be coupled to a source/drain region of the transfer transistor. In some embodiments, the floating diffusion region may be conductively connected to a source/drain region of the reset transistor by the conductive connector.

The methods may further include forming at least two floating diffusion regions in the second substrate, and forming a wiring in the second insulation layer. The wiring electrically connects the at least two floating diffusion regions and the conductive connector.

The methods may further include forming a wiring in the second insulation layer, forming a via hole that penetrates the wiring and a portion of the second insulation layer, forming a sacrificial connector in the via hole, etching a portion of the second substrate to expose the sacrificial connector, removing the sacrificial connector, forming a contact hole by etching the second insulation layer and a portion of the first insulation layer disposed under the via hole, and depositing a conductive material in the contact hole. The sacrificial connector includes a polymer material including carbon.

The methods may further include polishing a surface of the second substrate opposite the first substrate after adhering the first substrate and the second substrate, and forming a color filter and a lens on the polished surface of the second substrate.

The methods may further include forming a second photodiode and a second transfer transistor in the second substrate. The floating diffusion region may be coupled to source/drain regions of the first transfer transistor and the second transfer transistor.

BRIEF DESCRIPTION OF THE DRAWINGS

Illustrative, non-limiting some embodiments will be more clearly understood from the following detailed description taken in conjunction with the accompanying drawings.

DESCRIPTION OF THE EMBODIMENTS

Figure 1:
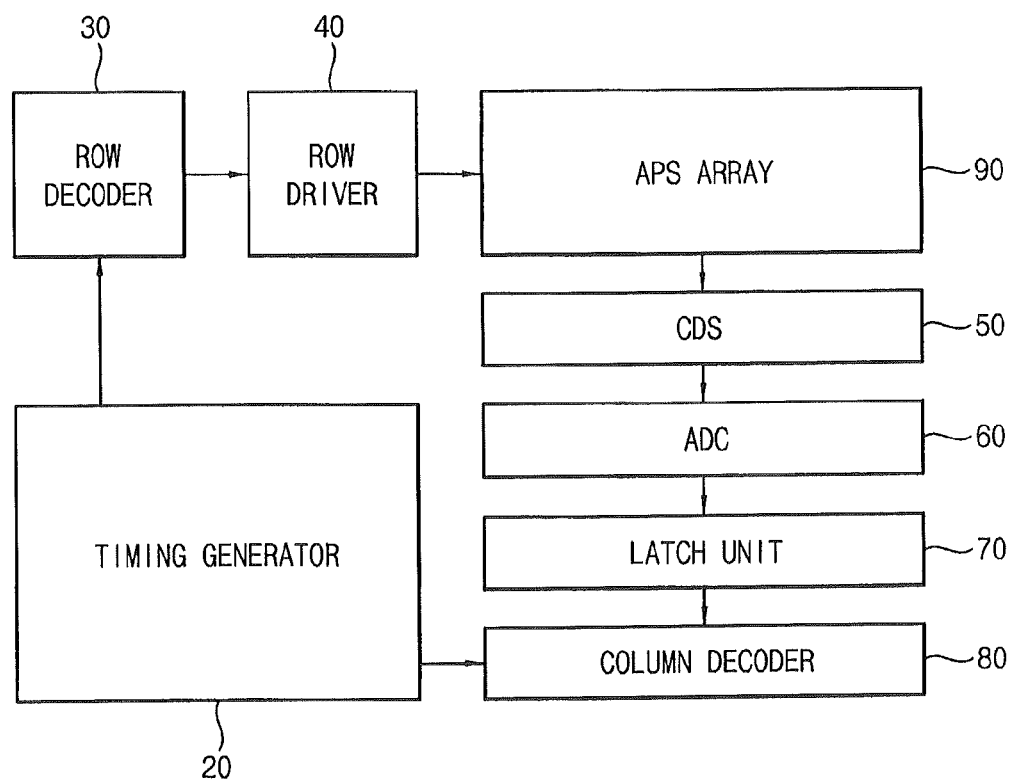
FIG. 1 is a block diagram illustrating an image sensor in accordance with some embodiments.

Various some embodiments will be described more fully hereinafter with reference to the accompanying drawings, in which some embodiments are shown. The present inventive concept may, however, be embodied in many different forms and should not be construed as limited to the some embodiments set forth herein. Rather, these embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular some embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2:
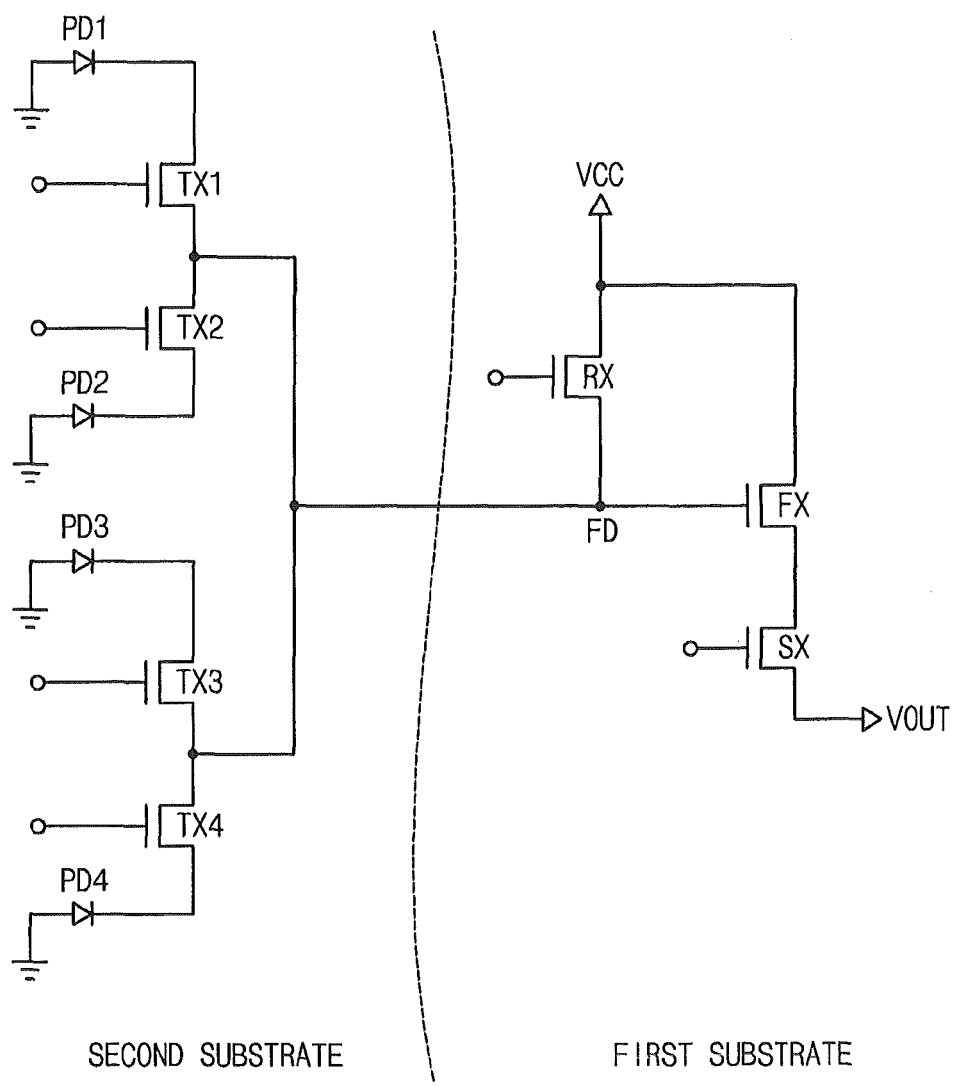
FIG. 2 is a circuit diagram illustrating an active pixel sensor (APS) of an image sensor in accordance with some embodiments.

FIG. 1 is a block diagram illustrating an image sensor in accordance with some embodiments. FIG. 2 is a circuit diagram illustrating an active pixel sensor (APS) of an image sensor in accordance with some embodiments.

Referring to FIG. 1, the image sensor includes an active pixel sensor (APS) array 90 and logic circuits. The APS array 90 may include a plurality of unit pixels. The logic circuits may include a timing generator 20, a row decoder 30, a row driver 40, a correlated double sampler (CDS) 50, an analog to digital converter (ADC) 60, a latch unit 70 and a column decoder 80.

In some embodiments, unit elements included in the APS array 90 may be disposed both on a first substrate and a second substrate. The logic circuits may be provided on the first substrate.

The unit pixel in the APS array 90 may include a photodiode and a plurality of transistors. When the unit pixel has a three-transistor construction, only the photodiode among the photodiode and the plurality of transistors may be disposed on the second substrate. When the unit pixel has a four-transistor construction, the photodiode and a transfer transistor may be disposed on the second substrate.

Hereinafter, the active pixel sensor in the image sensor will be described with reference to FIG. 2.

The active pixel sensor may convert an optical image into an electrical signal. The active pixel sensor may have a four shared pixel construction in which a first photodiode PD1, a second photodiode PD2, a third photodiode PD3 and a fourth photodiode PD4 are electrically connected to a common floating diffusion region FD to share read elements.

Referring to FIG. 2, the active pixel sensor includes the first photodiode PD1, the second photodiode PD2, the third photodiode PD3, the fourth photodiode PD4, a first transfer transistor TX1 electrically connected to the first photodiode PD1, a second transfer transistor TX2 electrically connected to the second photodiode PD2, a third transfer transistor TX3 electrically connected to the third photodiode PD3 and a fourth transfer transistor TX4 electrically connected to the fourth photodiode PD4. The first transfer transistor TX1, the second transfer transistor TX2, the third transfer transistor TX3 and the fourth transfer transistor TX4 are electrically connected to the common floating diffusion region FD. Charges stored in the first to the fourth photodiodes PD1, PD2, PD3 and PD4 may be transferred into the common floating diffusion region FD through the first to the fourth transfer transistors TX1, TX2, TX3 and TX4, respectively.

As illustrated in FIG. 2, the first to the fourth photodiodes PD1, PD2, PD3 and PD4, the first to the fourth transfer transistors TX1, TX2, TX3 and TX4, and the common floating diffusion region FD are disposed on the second substrate.

The common floating diffusion region FD may be electrically connected to a driving transistor FX. The driving transistor FX may be a source follower amplifier. The driving transistor FX may amplify a change in an electrical potential of the common floating diffusion region FD.

A reset transistor RX may be electrically connected to the common floating diffusion region FD and reset the electrical potential of the common floating diffusion region FD periodically. The reset transistor RX may reset the electrical potential of the common floating diffusion region FD using a bias voltage. For example, the reset transistor RX may reset the electrical potential of the common floating diffusion region FD by connecting a power supply voltage VCC to the common floating diffusion region FD.

A selection transistor SX may select a row including four shared pixels in response to a bias voltage provided through a selection line and provide an output of the driving transistor FX to an output line VOUT.

As illustrated in FIG. 2, the driving transistor FX, the reset transistor RX and the selection transistor SX are disposed on the first substrate. The read elements including the driving transistor FX, the reset transistor RX and the selection transistor SX may be shared by the four photodiodes PD1, PD2, PD3 and PD4. The read elements including the driving transistor FX, the reset transistor RX and the selection transistor SX may read each of a light signal incident on the four photo diodes PD1, PD2, PD3 and PD4.

As described above, the driving transistor FX, the reset transistor RX and the selection transistor SX are disposed on the first substrate, and the first to the fourth photodiodes PD1, PD2, PD3 and PD4, the first to the fourth transfer transistors TX1, TX2, TX3 and TX4 and the common floating diffusion region FD are disposed on the second substrate. The logic circuits are disposed on the first substrate. The image sensor according to some embodiments may have a three dimensional construction since the first substrate and the second substrate may be adhered to each other.

Figure 3:
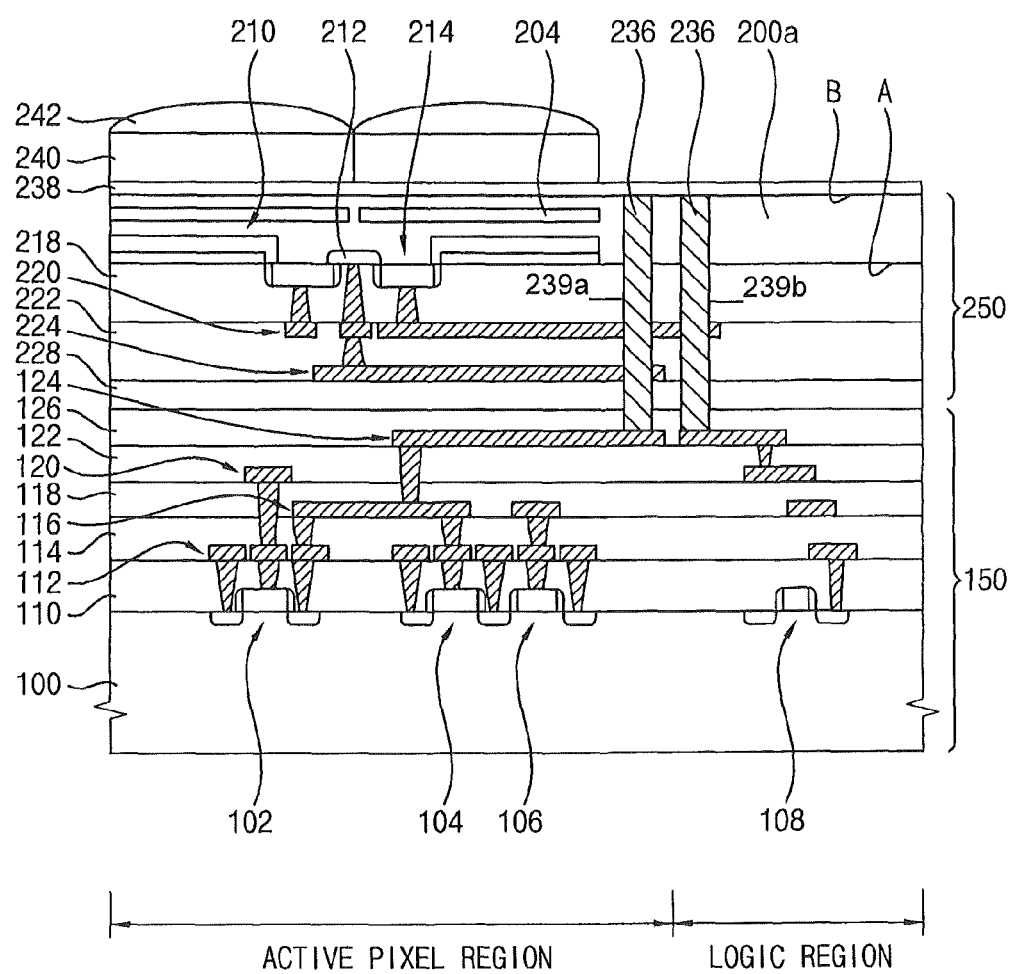
FIG. 3 is a cross-sectional view illustrating an image sensor in accordance with some embodiments.
Figure 4:
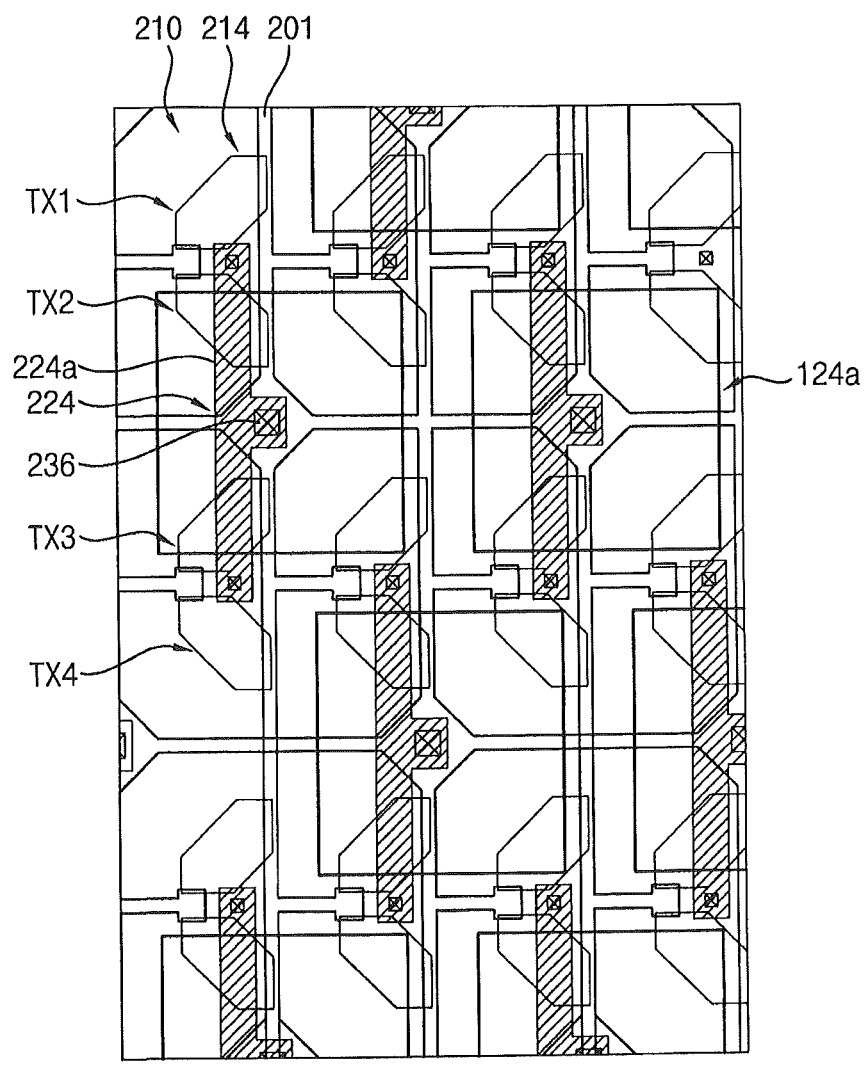
FIG. 4 is a top view of a second substrate included in an image sensor of FIG. 3.

FIG. 3 is a cross-sectional view illustrating an image sensor in accordance with some embodiments, and FIG. 4 is a top view of a second substrate included in an image sensor of FIG. 3.

Hereinafter, the image sensor will be described in detail with reference to FIGS. 3 and 4. In FIG. 3, a reference numeral 150 represents elements provided on a first substrate 100 and a reference numeral 250 indicates elements positioned on a second substrate 200a.

Referring to FIG. 3, the first substrate 100 may include a single crystalline material. For example, the first substrate 100 may include single crystalline silicon, single crystalline germanium, etc. The first substrate 100 includes an active pixel region and a logic region. A selection transistor 106, a driving transistor 104 and a reset transistor 102 are disposed in the active pixel region. A transistor 108 included in the logic circuits is located in the logic region. Each of the transistors 102, 104, 106 and 108 on the first substrate 100 may include a gate insulation layer, a gate electrode and impurity regions. A spacer may be provided on a sidewall of each gate electrode.

A first insulation layer 110, a second insulation layer 114, a third insulation layer 118, a fourth insulation layer 122 and a fifth insulation layer 126 covering the transistors 102, 104, 106 and 108 are sequentially disposed on the first substrate 100. A first wiring 112, a second wiring 116, a third wiring 120 and a fourth wiring 124 are formed through the first to the fifth insulation layers 110, 114, 118, 122 and 126, respectively. The first to the fourth wirings 112, 116, 120 and 124 may be electrically connected to the transistors 102, 104, 106 and 108 on the first substrate 100. Each of the first to the fourth wirings 112, 116, 120 and 124 includes a contact plug and a conductive pattern. The conductive pattern may have a line shape or a pad shape. The first to the fifth insulation layers 110, 114, 118, 122 and 126 may include silicon oxide. The first to the fourth wirings 112, 116, 120 and 124 may include polysilicon, metal, metal nitride, metal silicide, etc. In some embodiments, the first to the fourth wirings 112, 116, 120 and 124 may include a material such as tungsten being easily patterned by a photolithography process.

The first insulation layer 110, the first wiring 112, the second insulation layer 114, the second wiring 116, the third insulation layer 118, the third wiring 120, the fourth insulation layer 122 and the fourth wiring 124 are sequentially provided on the first substrate 100. The first wiring 112 may be directly connected to the impurity regions and the gate electrodes of the transistors 102, 104, 106 and 108. The second wiring 116 may be electrically connected to the impurity regions of the reset transistor 102 and the gate electrode of the driving transistor 104. Additionally, the second wiring 116 may be electrically connected to the gate electrode of the selection transistor 106. The third wiring 120 may make electrical contact with the gate electrode of the reset transistor 102. The fourth wiring 124 may be electrically connected to the second wiring 116.

A conductive pattern 124a (see FIG. 4) of the fourth wiring 124 may have a shape extending in a direction substantially parallel to the first substrate 100. The conductive pattern 124a may have an area substantially the same as or substantially similar to a sum of horizontal areas of the four photodiodes PD1, PD2, PD3 and PD4. For example, the conductive pattern 124a may have a rectangular shape each side of which may be substantially larger than about 1.2 μm.

The first to the fourth wirings 112, 116, 120 and 124 are also provided in the logic region of the first substrate 100. The first to the fourth wirings 112, 116, 120 and 124 may be electrically connected to the logic circuits in the logic region.

The fifth insulation layer 126 covering the fourth wiring 124 is located on the first substrate 100. The fifth insulation layer 126 may include oxide such as silicon oxide. For example, the fifth insulation layer 126 may include high density plasma-chemical vapor deposition (HDP-CVD) oxide. The fifth insulation layer 126 may have a thickness of about 1,500 Å to about 3,500 Å measured from an upper surface of the conductive pattern 124a of the fourth wiring 124.

Referring now to FIGS. 3 and 4, the second substrate 200a may also include a single crystalline material. For example, the second substrate 200a may include single crystalline silicon or single crystalline germanium. The second substrate 200a may be obtained by an epitaxial process.

An isolation layer pattern 201 is disposed in the second substrate 200a. The isolation layer pattern 201 may have a predetermined thickness from a first surface A of the second substrate 200a. The isolation layer pattern 201 may electrically isolate photodiodes 210 from each other. In some embodiments, the isolation layer pattern 201 may electrically isolate the photodiodes 210 by a unit of two adjacent photodiodes.

The photodiodes 210 are provided in the second substrate 200a. Each of the photodiodes 210 may also have predetermined depth from the first surface A of the second substrate 200a. The photodiode 210 may include a first impurity region and a second impurity region located on the first impurity region. For example, the first impurity region may include N-type impurities whereas the second impurity region may include P-type impurities.

A transfer transistor 214 is positioned on the first surface A of the second substrate 200a. The transfer transistor 214 may be disposed adjacent to one end of the photodiode 210. In some embodiments, one transfer transistor 214 may be electrically connected to one photodiode 210. A gate electrode of the transfer transistor 214 may protrude downwardly (that is, toward the first substrate 100) from the first surface A of the second substrate 200a. Two adjacent transfer transistors 214 may share one common impurity region. For example, two adjacent transfer transistors 214 may include one common source region.

A floating diffusion region 212 is provided beneath the first surface A of the second substrate 200a between two adjacent transfer transistors 214. The floating diffusion region 212 may serve as the common impurity region of the two transfer transistors 214 so that two adjacent transfer transistors 214 may share the floating diffusion region 212. Charges stored in the photodiodes 210 may be transferred into the floating diffusion region 212 through the transfer transistors 214.

An eighth insulation layer 218, a seventh insulation layer 222 and a sixth insulation layer 228, which cover the transfer transistor 214, the floating diffusion region 212 and the photodiode 210, are successively disposed under the first surface A of the second substrate 200a. A sixth wiring 220 and a fifth wiring 224 are disposed through the eighth to the sixth insulation layers 218, 222 and 228 to be electrically connected to the transfer transistor 214 and the floating diffusion region 212. The eighth to the sixth insulation layers 218, 222 and 228 may include oxide, for example, silicon oxide. The sixth and the fifth wirings 220 and 224 may include polysilicon, metal, metal nitride, metal silicide, etc. In some embodiments, the sixth and the fifth wirings 220 and 224 may include a material such as tungsten being easily patterned by a photolithography process.

The eighth insulation layer 218 covers the floating diffusion region 212, the photodiode 210 and the transfer transistor 214. The sixth wiring 220, the seventh insulation layer 222 and the fifth wiring 224 are successively provided under the first surface A of the second substrate 200a. The sixth wiring 220 may be directly connected to the impurity region, the gate electrode and the floating diffusion region 212 of the transfer transistor 214. The fifth wiring 224 may electrically connect one floating diffusion region 212 to an adjacent floating diffusion region 212. When two adjacent floating diffusion regions 212 are connected to each other by the fifth wiring 224, the four photodiodes PD1, PD2, PD3 and PD4 may share a common floating diffusion region.

The sixth insulation layer 228 covering the fifth wiring 224 is provided under the first surface A of the second substrate 200a. A lower surface of the sixth insulation layer 228 may make contact with an upper surface of the fifth insulation layer 126. The sixth insulation layer 228 may include a material substantially the same as or substantially similar to that of the fifth insulation layer 126. For example, the sixth insulation layer 228 may include HPD-CVD oxide. The sixth insulation layer 228 may have a thickness of about 1,500 Å to about 3,500 Å based on a lower surface of a conductive pattern 224a of the fifth wiring 224. A total thickness of the fifth insulation layer 126 and the sixth insulation layer 228 may be in a range of about 5,500 Å to about 7,000 Å between the fourth wiring 124 and the fifth wiring 224

A P-well (not illustrated) is located in the second substrate 200a from a second surface B of the second substrate 200a. An N-well 204 is provided in the second substrate 200a beneath the P-well. The N-well 204 may correspond to the photodiode 210. The N-well 204 may be disposed to be spaced apart from the photodiode 210. The P-well and the N-well 204 may prevent or discourage negative charges generated by an incident light from undesirably moving toward a photodiode included in an adjacent pixel.

A connecting member penetrates the second substrate 200a, the eighth to the sixth insulation layers 218, 222 and 228, and the sixth and the fifth wirings 220 and 224 from the second surface B of the second substrate 200a. The connecting member is electrically connected to the fourth wiring 124 on the first substrate 100. In some embodiments, the connecting member may include a contact plug 236. The sixth and the fifth wirings 220 and 224 positioned on the second substrate 200a and the first to the fourth wirings 112, 116, 120 and 124 located on the first substrate 100 may be electrically connected to one another by the contact plug 236. The contact plug 236 may include a conductive material, such as polysilicon, a metal and/or a metal compound. The contact plug 236 may have a relatively small width, for example, in a range of about 180 nm to about 220 nm. Additionally, the contact plug 236 may extend into the structure by a depth of about 2 μm or more.

As illustrated in FIG. 3, the contact plug 236 electrically may connect the floating diffusion region 212 on the second substrate 200a to the transistors 102, 104, 106 and 108 on the first substrate 100.

Two adjacent floating diffusion regions 212 on the second substrate 200a may be connected to each other by the fifth wiring 224 and the sixth wiring 220. The four photodiodes PD1, PD2, PD3 and PD4 and the four transfer transistors TX1, TX2, TX3 and TX4 may share the common floating diffusion regions 212. Thus, one contact plug 236 may be provided for the four photodiodes PD1, PD2, PD3 and PD4. As a result, the number of the contact plug 236, which penetrates from the second substrate 200a to the first substrate 100, may be reduced because a plurality of photodiodes and a plurality of transfer transistors may have the common floating diffusion regions 212.

An anti-reflective layer 238 is provided on the second surface B of the second substrate 200a. The anti-reflective layer 238 may prevent or discourage an incident light from reflecting on the second surface B of the second substrate 200a. The anti-reflective layer 238 may include silicon nitride, silicon oxynitride, tantalum oxide, titanium oxide, hafnium oxide, etc. These may be used alone or in a combination thereof. The anti-reflective layer 238 may have a thickness in a range of several tens of angstroms up to several hundreds of angstroms.

A color filter 240 is provided on the anti-reflective layer 238, and a micro lens 242 is disposed on the color filter 240. The color filter 240 and the micro lens 242 may be positioned over the active pixel region of the first substrate 100.

Figure 34:
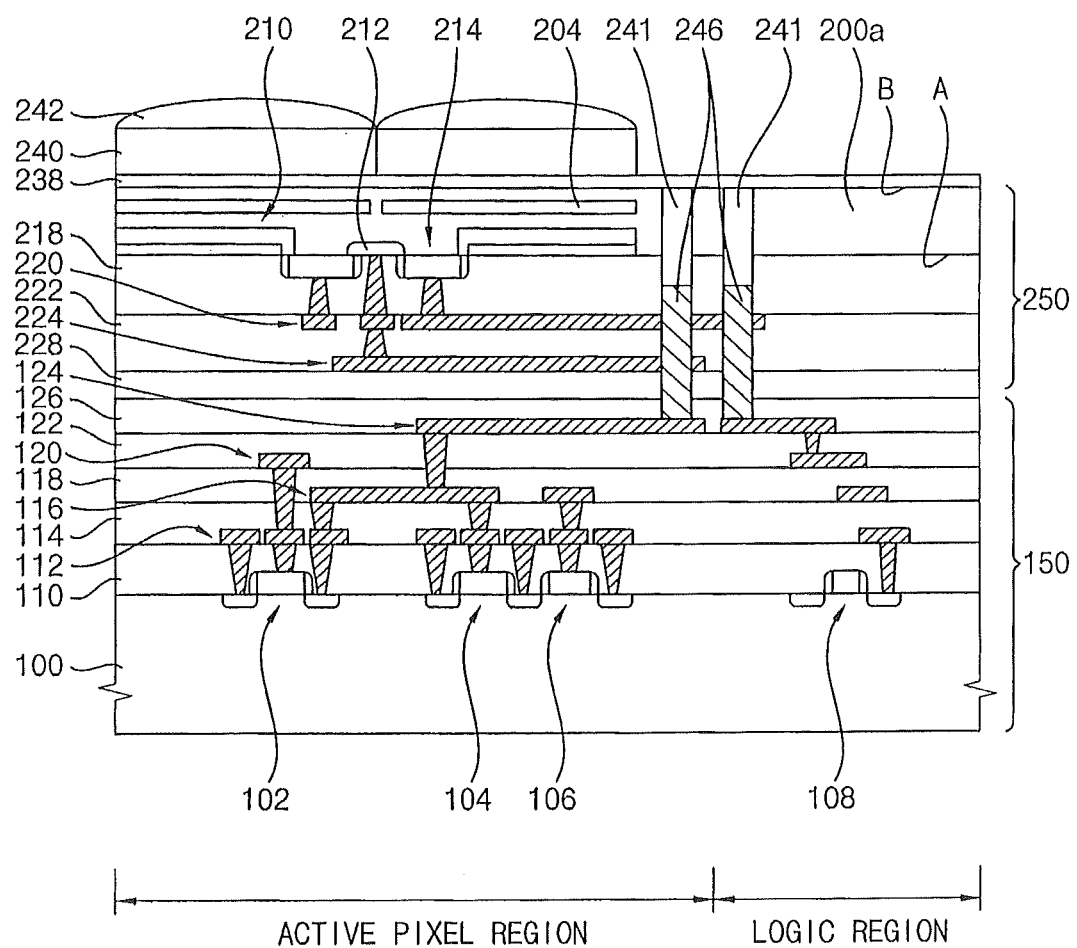

Further embodiments are illustrated in FIG. 34, which is a cross-sectional view illustrating an image sensor in accordance with some embodiments. The embodiments of FIG. 34 are similar to the embodiments illustrated in FIG. 3, except as described below. As shown in FIG. 34, a conductive contact plug 246 may not extend into or to the surface of the second substrate 200a. Rather, the conductive contact plug 246 may be formed to partially fill a via that extends through the second substrate 200a to the fourth wiring 124. An insulation material 241, such as silicon oxide, may be deposited in the via above the conductive contact plug 246, and may extend from the second surface B of the second substrate 200a to or into the eighth insulation layer 218. The conductive contact plug 246 may electrically connect the fourth wiring 124, the fifth wiring 224, and the sixth wiring 220.

FIGS. 5 to 20 are cross-sectional views illustrating methods of manufacturing image sensors in accordance with some embodiments. In some embodiments, image sensors may be obtained by combining a first substrate with a second substrate after forming a plurality elements and wirings on the first substrate and the second substrate.

Figure 5:
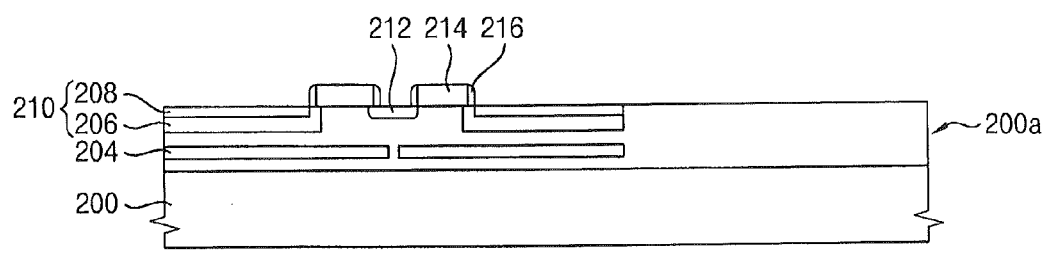
FIGS. 5 to 20 are cross-sectional views illustrating methods of manufacturing an image sensor in accordance with some embodiments.

Referring to FIG. 5, a second substrate 200 including a single crystalline silicon layer 200a is provided. The single crystalline silicon layer 200a may be formed on the second substrate 200 by an epitaxial process. Hereinafter, an upper surface of the single crystalline silicon layer 200a is referred to as a first surface of the second substrate 200 and a lower surface of the second substrate 200 is referred to as a second surface of the second substrate 200. The second substrate 200 may be doped with P-type impurities.

Isolation layer patterns (not illustrated) may be formed in the second substrate 200 from the first surface of the second substrate 200 by an isolation process. For example, the isolation process may include a shallow trench isolation (STI) process, a local oxidation of silicon (LOCOS) process, etc.

An N-well 204 is formed in the second substrate 200 by implanting and diffusing N-type impurities from the first surface of the second substrate 200. In some embodiments, a P-well may be formed in the second substrate 200 when N-type impurities are previously doped into the second substrate 200. That is, the conductive types of the well and the second substrate 200 may vary as conductive types of transistors, photodiodes, etc.

A photodiode 210, a transfer transistor 214 and a floating diffusion region 212 are formed on the first surface of the second substrate 200.

In some embodiments, a parasitic capacitor among between a gate of a driving transistor FX, a drain of a reset transistor RX and a metal contact of the transfer transistor 214 may be used as the floating diffusion region 212 without forming an additional floating diffusion region.

According to some embodiments, an N-type photo diode region 206 is formed by doping N-type impurities under the first surface of the second substrate 200. A gate of the transfer transistor 214 is formed on the first surface of the second substrate 200, and a spacer 216 is formed on a sidewall of the gate of the transfer transistor 214. A P-type photodiode region 208 is formed on the N-type photodiode region 206 by doping P-type impurities beneath the first surface of the second substrate 200. The floating diffusion region 212 is formed in the first surface of the second substrate 200 by implanting impurities between gate electrodes of the transfer transistors 214. Adjacent transfer transistors 214 may share one common floating diffusion region 212.

Figure 6:
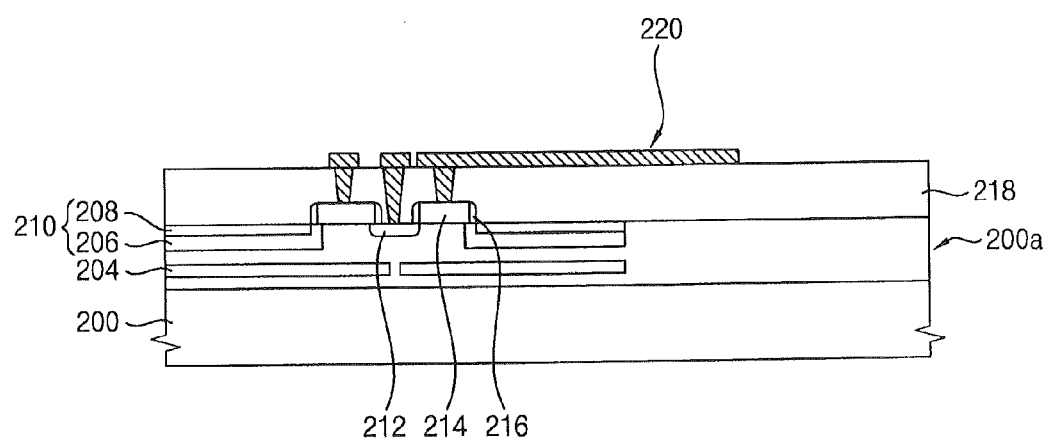

Referring to FIG. 6, an eighth insulation layer 218 covering the photodiode 210, the floating diffusion region 212 and the transfer transistor 214 is formed on the second substrate 200 having the single crystalline silicon layer 200a.

First contact plugs are formed through the eighth insulation layer 218. The first contact plugs may make contact with the gate of the transfer transistor 214 and the floating diffusion region 212. A first conductive pattern is formed on the eighth insulation layer 218 to be connected to the first contact plug. The first conductive pattern may be formed by depositing a conductive material and patterning the deposited conductive material by a photolithography process.

In some embodiments, the first contact plug and the first conductive pattern together serve as a sixth wiring 220. The first contact plug may include a material substantially the same as or substantially similar to that of the first conductive pattern. Alternatively, the first contact plug and the first conductive pattern may include different materials, respectively. For example, the first contact plug and the first conductive pattern may include polysilicon, metal, metal nitride, metal silicide, etc. In some embodiments, the first conductive pattern may include tungsten considering an etching process for forming the first conductive pattern.

Figure 7:
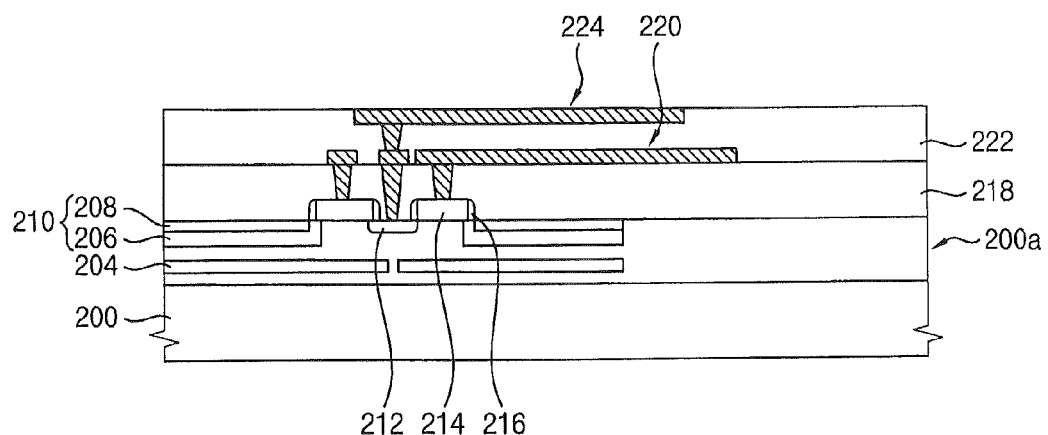

Referring to FIG. 7, a seventh insulation layer 222 is formed on the eighth insulation layer 218. The seventh insulation layer 222 may sufficiently cover the sixth wiring 220.

A second contact plug is formed through the seventh insulation layer 222 and to contact with the first conductive pattern. A second conductive pattern is formed on the seventh insulation layer 222 to be connected to the second contact plug. The second contact plug and the second conductive pattern may serve together as a fifth wiring 224. The fifth wiring 224 may be electrically connected to the sixth wiring 220. For example, the second contact plug may make contact with the first conductive pattern.

An additional insulation layer (not illustrated) is formed to cover the second conductive pattern, and then the additional insulation layer is planarized to expose an upper surface of the second conductive pattern. Thus, the second conductive pattern and the seventh insulation layer 222 may have level surfaces. Alternatively, the additional insulation layer may not be planarized as occasion demands.

Figure 8:
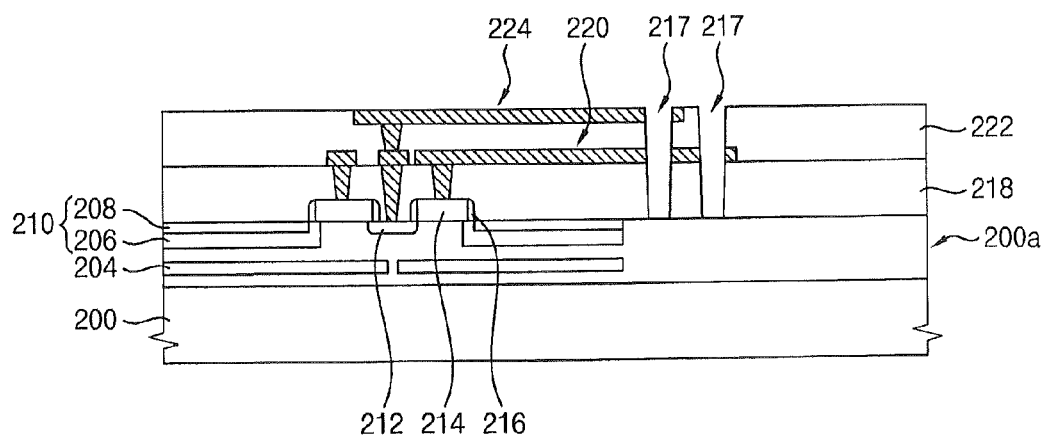

Referring to FIG. 8, first contact holes 217 are formed through the seventh and the eighth insulation layer 222 and 218 by an etching process. The first contact holes 217 may penetrate at least one of the second conductive pattern and the first conductive pattern. The first contact holes 217 expose the first surface of the second substrate 200. In some embodiments, some of the first contact holes 217 may penetrate the second conductive pattern and the first conductive pattern through the seventh insulation layer 222 and the eighth insulation layer 218. Others of the first contact holes 217 may penetrate the first conductive pattern through the seventh insulation layer 222 and the eighth insulation layer 218 without contacting the fifth wiring 224. The first contact holes 217 may expose portions of the second substrate 200 on which the photodiode 210 and the transfer transistor 214 are not formed.

Figure 9:
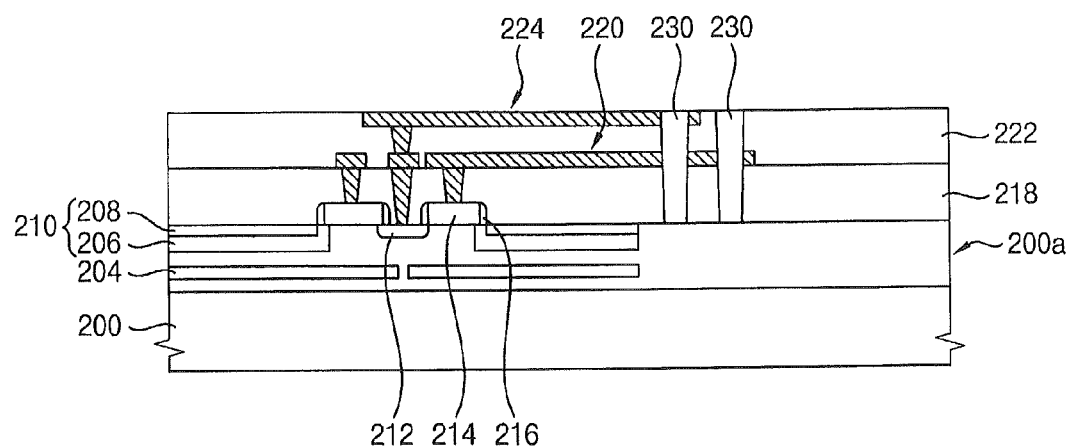

Referring to FIG. 9, a sacrificial layer (not illustrated) is formed on the fifth wiring 224 and the seventh insulation layer 222 to fill up the first contact holes 217. The sacrificial layer may be formed using a material being easily removed by an ashing process. For example, the sacrificial layer may be formed using a carbon-containing material such as polymer including carbon.

Sacrificial plugs 230 are formed in the first contact holes 217 by planarizing the sacrificial layer to expose upper surfaces of the fifth wiring 224 and the seventh insulation layer 222.

Figure 10:
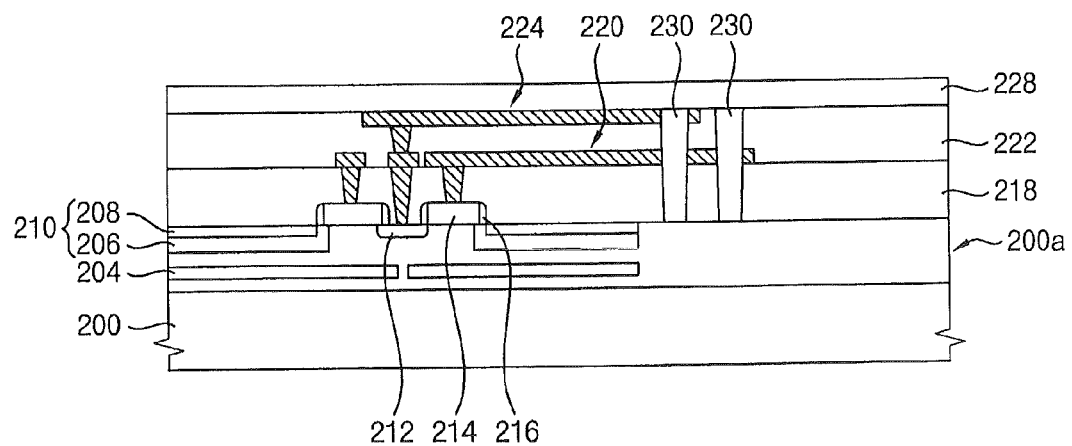

Referring to FIG. 10, a sixth insulation layer 228 is formed on the seventh insulation layer 222 and the sacrificial plugs 230. The sixth insulation layer 228 may include oxide such as silicon oxide. For example, sixth insulation layer 228 may include HDP-CVD oxide. As will be described later, an upper surface of the sixth insulation layer 228 may make contact with the first substrate. Any conductive materials are not exposed on the upper surface of the sixth insulation layer 228. Only oxide such as silicon oxide is exposed on the upper surface of the sixth insulation layer 228.

The sixth insulation layer 228 is preferred to have a level upper surface since the upper surface of the sixth insulation layer 228 may make contact with the first substrate. As described above, the seventh insulation layer 222 and the fifth wiring 224 may have level upper surfaces. As a result, the sixth insulation layer 228 may have a level upper surface without an additional planarization process.

When the sixth insulation layer 228 has a thickness of less than about 1000 Å, the sixth insulation layer 228 may not perform an insulating function. When the sixth insulation layer 228 has a thickness of more than about 3500 Å, it is hard to etch the sixth insulation layer 228 in following etching processes. Therefore, the sixth insulation layer 228 may have a thickness of about 1000 Å to about 3500 Å.

Figure 11:
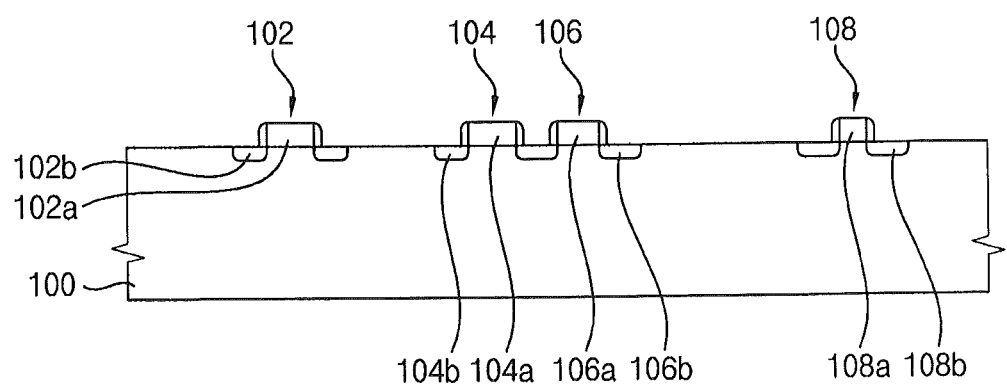

Referring to FIG. 11, a first substrate 100 including a single crystalline silicon is provided. A bulk silicon substrate may be used as the first substrate 100. Isolation layer patterns (not illustrated) may be formed in the first substrate 100 by an isolation process. The first substrate 100 includes an active pixel region and a logic region.

A selection transistor 106, a driving transistor 104 and a reset transistor 102 are disposed in the active pixel region. A transistor 108 included in the logic circuits is located in the logic region.

Gates 102a, 104a and 106a of the reset transistor 102, the driving transistor 104 and the selection transistor 106, respectively, may be formed on a first surface of the first substrate 100 in the active pixel region. A gate 108a of the transistor 108 may be formed on the first surface of the first substrate 100 in the logic region. Impurity regions 102b, 104b, 106b and 108b, which serve as source regions and drain regions, may be formed by implanting impurities beneath the first surface of the first substrate 100 around both sides of the gates 102a, 104a, 106a and 108a.

Figure 12:
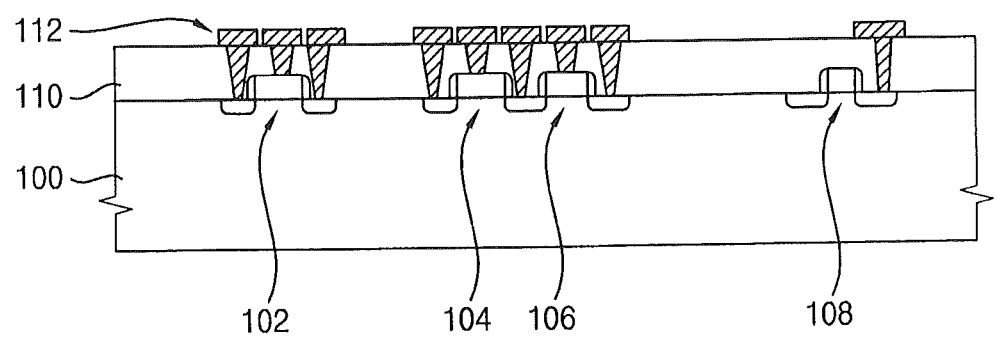

Referring to FIG. 12, a first insulation layer 110 covering the transistors 102, 104, 106 and 108 is formed on the first substrate 100.

Third contact plugs are formed through the first insulation layer 110. The third contact plugs may make contact with the gates and the impurity regions of the reset transistor 102, the driving transistor 104, the selection transistor 106 and the transistor 108.

A third conductive pattern is formed on the first insulation layer 110 to be connected to the third contact plug. The third conductive pattern may be formed by depositing a conductive material and patterning the deposited conductive material by a photolithography process.

In some embodiments, the third contact plug and the third conductive pattern together may serve as a first wiring 112. The third contact plug may include a material substantially the same as or substantially similar to that of the third conductive pattern. Alternatively, the third contact plug and the third conductive pattern may include different materials, respectively. For example, the third contact plug and the third conductive pattern may include polysilicon, metal, metal nitride, metal silicide, etc. In some embodiments, the third conductive pattern may include tungsten considering an etching process forming the third conductive pattern.

Figure 13:
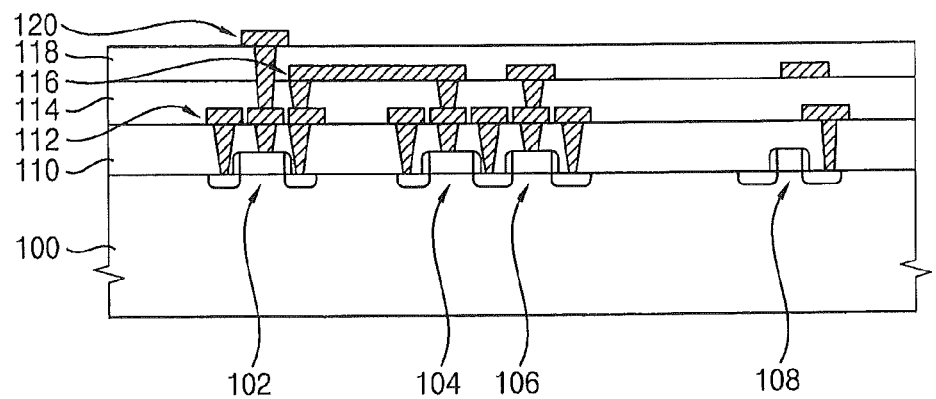

Referring to FIG. 13, a second insulation layer 114 is formed on the first insulation layer 110. The second insulation layer 114 may sufficiently cover the first wiring 112. A fourth contact plug is formed through the second insulation layer 114 and to contact with the third conductive pattern. The fourth contact plug may be electrically connected to one of the impurity regions of the reset transistor 102, the gate of the driving transistor 104 and the gate of the selection transistor 106.

A fourth conductive pattern is formed on the second insulation layer 114 to be connected to the fourth contact plug. The fourth contact plug and the fourth conductive pattern together may serve as a second wiring 116. The fourth conductive pattern may electrically connect adjacent fourth contact plugs to each other. For example, the fourth conductive pattern may connect the fourth contact plug contacting with the impurity region of the reset transistor 102 to the fourth contact plug contacting with the gate of the driving transistor 104. In this way, the impurity region of the reset transistor 102 may be connected to the gate of the driving transistor 104. The fourth contact plug and the fourth conductive pattern are also provided in the logic region of the first substrate 100.

The third insulation layer 118 is formed on the second insulation layer 114. A fifth contact plug is formed through the third insulation layer 118 and the second insulation layer 114 and to contact with the third conductive pattern. For example, the fifth contact plug may make contact with the gate of the reset transistor 102.

A fifth conductive pattern is formed on the third insulation layer 118 to be connected to the fifth contact plug. The fifth contact plug and the fifth conductive pattern together may serve as a third wiring 120. The fifth contact plug and the fifth conductive pattern are also provided in the logic region of the first substrate 100.

Figure 14:
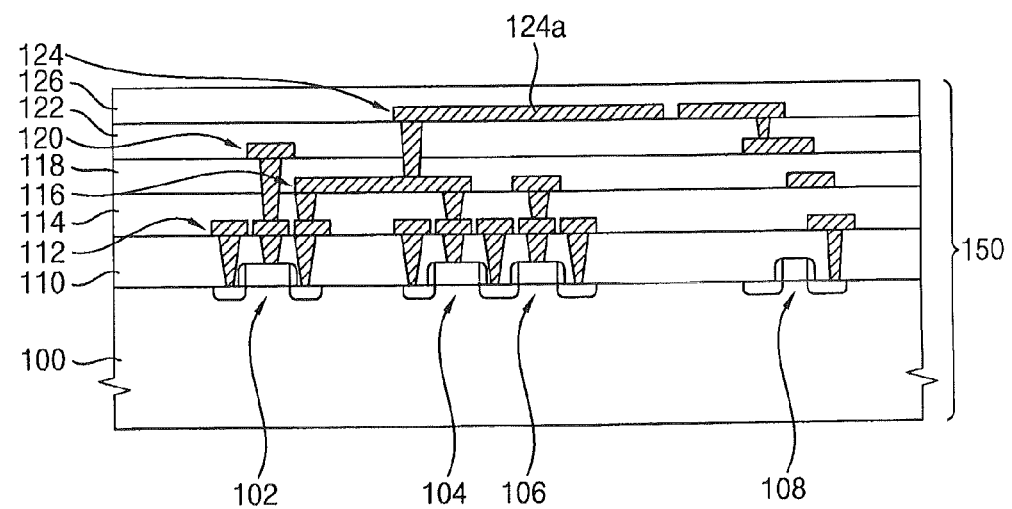

Referring to FIG. 14, a fourth insulation layer 122 is formed on the third insulation layer 118. A sixth contact plug is formed through the fourth insulation layer 122 and the third insulation layer 118 to contact with the fourth conductive pattern. As illustrated in FIG. 14, the sixth contact plug may make contact with the fourth conductive pattern connecting the impurity region of the reset transistor 102 to the gate of the driving transistor 104.

A sixth conductive pattern 124a is formed on the fourth insulation layer 122 to be connected to the sixth contact plug. The sixth contact plug and the sixth conductive pattern 124a together may serve as a fourth wiring 124. The sixth contact plug and the sixth conductive pattern 124a are also provided in the logic region of the first substrate 100.

The sixth conductive pattern 124a is a topmost conductive pattern among the third to the sixth conductive patterns on the first substrate 100. As will be described later, the sixth conductive pattern 124a may be electrically connected to the first and/or the second conductive pattern of the second substrate 200. Therefore, the sixth conductive pattern 124a is preferred to have a large horizontal area, so that the sixth conductive pattern 124a of the first substrate 100 and the first and second conductive patterns on the second substrate 200 may be electrically connected to each other without a misalignment. The sixth conductive pattern 124a of the first substrate 100 may have a shape extending in a direction substantially parallel to the first substrate 100.

The image sensor according to some embodiments may have a four shared pixel construction in which four photodiodes share read elements. Therefore, the sixth conductive pattern 124a may have as much area substantially the same as or substantially similar to a sum of horizontal areas of four photodiodes formed in the second substrate 200.

The sixth conductive pattern 124a provided in the logic region also has a large horizontal area to increase an alignment margin.

An additional insulation layer (not illustrated) is formed to cover the sixth conductive pattern 124a, and then the additional insulation layer is planarized to expose an upper surface of the sixth conductive pattern 124a. A fifth insulation layer 126 is formed on the additional insulation layer and the sixth conductive pattern 124a. The fifth insulation layer 126 may include a material substantially the same as or substantially similar to that of the sixth insulation layer 228. For example, the fifth insulation layer 126 may include HDP-CVD oxide.

As will be described later, an upper surface of the fifth insulation layer 126 may make contact with the second substrate 200. Any conductive materials are not exposed on the upper surface of the fifth insulation layer 126. Only oxide such as silicon oxide is exposed on the upper surface of the fifth insulation layer 126.

The fifth insulation layer 126 may have a thickness of about 1,500 Å to about 3,500 Å measured from an upper surface of the sixth conductive pattern 124a. A total thickness of the fifth insulation layer 126 on the first substrate 100 and the sixth insulation layer 228 on the second substrate 200 may be less than about 7,000 Å. When the total thickness of the fifth insulation layer 126 and the sixth insulation layer 228 is more than about 7,000 Å, it is hard to etch the fifth insulation layer 126 and the sixth insulation layer 228 in following etching processes. The total thickness of the fifth insulation layer 126 and the sixth insulation layer 228 may be in a range of about 5,000 Å to about 6,000 Å.

Figure 15:
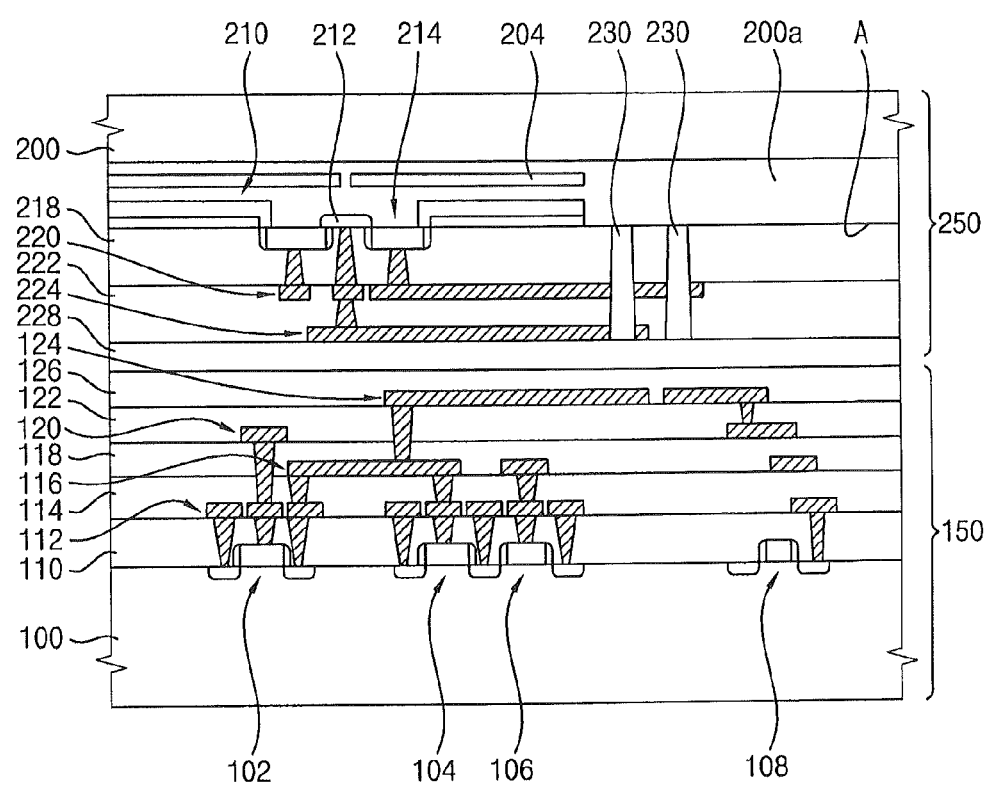

Referring to FIG. 15, the fifth insulation layer 126 on the first substrate 100 and the sixth insulation layer 228 on the second substrate 200 are adhered to each other by aligning, contacting and compressing the fifth insulation layer 126 and the sixth insulation layer 228, and performing a thermal treatment on two compressed insulation layers. At least a portion of the fourth wiring 124 on the first substrate 100 may correspond to the sacrificial plug 230 on the second substrate 200.

Since the sixth conductive pattern 124a on the first substrate 100 has a shape extending in a direction substantially parallel to the first substrate 100, it is easy to align the first substrate 100 with the second substrate 200, such that the sixth conductive pattern 124a may correspond to the sacrificial plug 230. For example, the sixth conductive pattern 124a may have a rectangular shape each side of which may be substantially larger than about 1.2 μm. In this case, an alignment margin between the sixth conductive pattern 124a and the sacrificial plug 230 may be enlarged to about 1.2 μm along both x-direction and y-direction.

Hereinafter, a process for adhering the fifth insulation layer 126 on the first substrate 100 to the sixth insulation layer 228 on the second substrate 200 will be described. At first, surfaces of the fifth insulation layer 126 and the sixth insulation layer 228 may be cleaned for removing particles from the surfaces of the fifth insulation layer 126 and the sixth insulation layer 228. The surface of the fifth insulation layer 126 may be aligned and contacted with the surface of the sixth insulation layer 228, and a thermal treatment is performed on the surfaces of the fifth insulation layer 126 and the sixth insulation layer 228 to increase adhesive strength between the surfaces of the fifth insulation layer 126 and the sixth insulation layer 228. The thermal treatment may be performed at a temperature of about 300° C. to about 700° C.

As illustrated in FIG. 15, the gates of the transfer transistors 214 may protrude downwardly (that is, toward the first substrate 100) from the first surface A of the second substrate 200. The fifth and the sixth wirings 224 and 220 being electrically connected to the transfer transistor 214 may be placed below the transfer transistor 214. Any wirings may be not placed above the photodiode 210.

The sixth insulation layer 228, the seventh insulation layer 222 and the eighth insulation layer 218 are sequentially disposed on the fifth insulation layer 126. The fifth wiring 224 may be placed between the sixth insulation layer 228 and the seventh insulation layer 222, and the sixth wiring 220 may be placed between the seventh insulation layer 222 and the eighth insulation layer 218.

In conventional techniques, a metal layer or a metal pattern is exposed on at least one of adhesion surfaces of a first substrate and a second substrate. In this case, dishing easily occurs on a surface of the metal layer during a planarization process performed on the adhesion surfaces of the first substrate and the second substrate before adhering the first substrate to the second substrate. That is, the metal layer may not have level surface. The metal layer may have a sink around a center of the metal layer. It is hard to adhere the first substrate to the second substrate around where dishing occurred. Additionally, the metal layer is easily oxidized during the thermal treatment process. When the metal layer is oxidized, a resistance of the metal layer increases at an oxidized region and the adhering process is not performed well.

In contrast, according to some embodiments, metal material is not exposed on the fifth insulation layer 126 and the sixth insulation layer 228. Only oxide such as silicon oxide is exposed on the fifth insulation layer 126 and the sixth insulation layer 228. Therefore, the problems described above may not occur.

Figure 16:
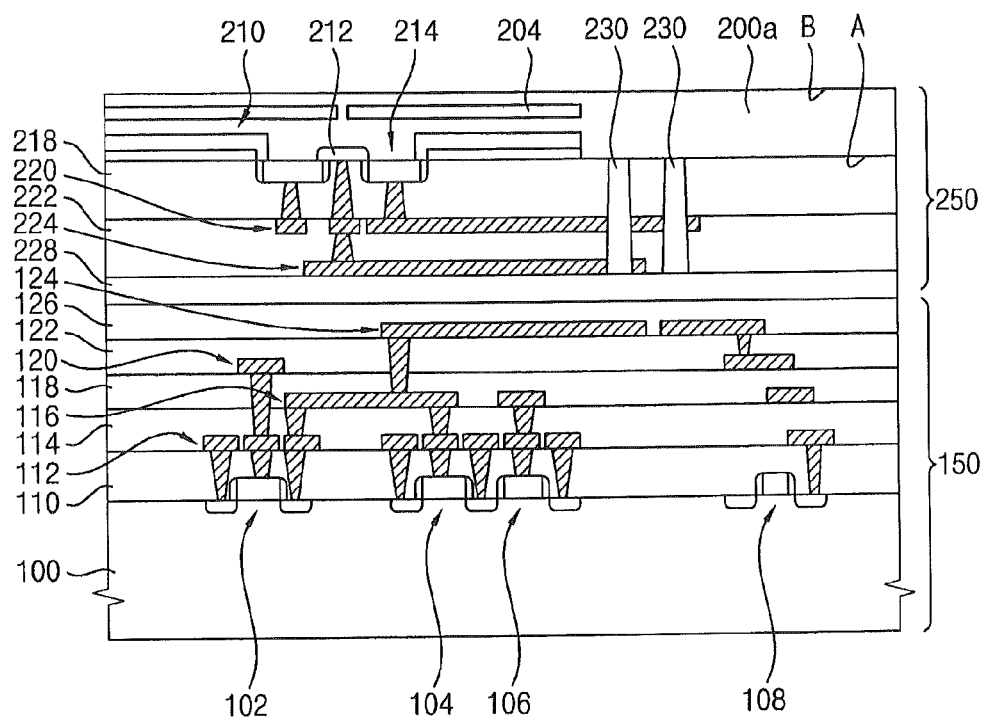

Referring to FIG. 16, a second surface B of the second substrate 200 is removed by a polishing process, such that only the single crystalline silicon layer 200a is remained, in which the second surface B corresponds to the first surface A. The second substrate 200a remained after the polishing process may have a thickness less than about 7,000 Å.

Figure 17:
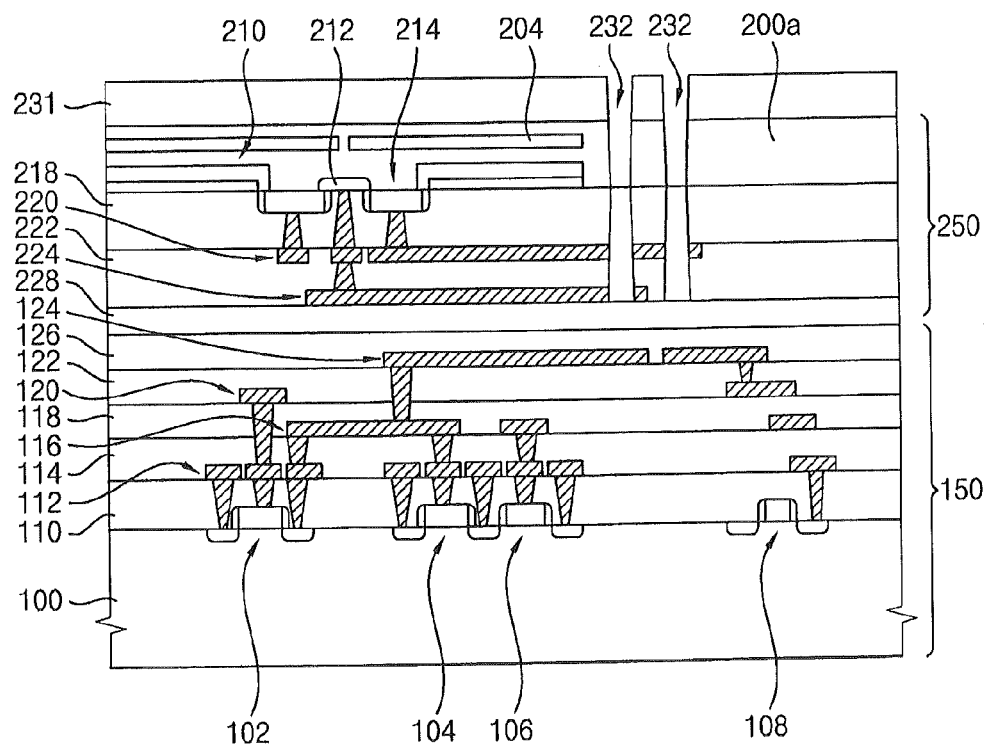

Referring to FIG. 17, a photo resist pattern 231 is formed on the second surface B of the second substrate 200a. The photo resist pattern 231 may partially expose the second surface B. Portions of the second surface B being exposed by the photo resist pattern 231 may correspond to the sacrificial plugs 230. A protective layer (not illustrated) may be further formed on the second surface B to protect the second substrate 200a.

Second contact holes 232 are formed by etching portions of the second substrate 200a exposed by the photo resist pattern 231. The second contact holes 232 may expose upper surfaces of the sacrificial plugs 230.

Figure 18:
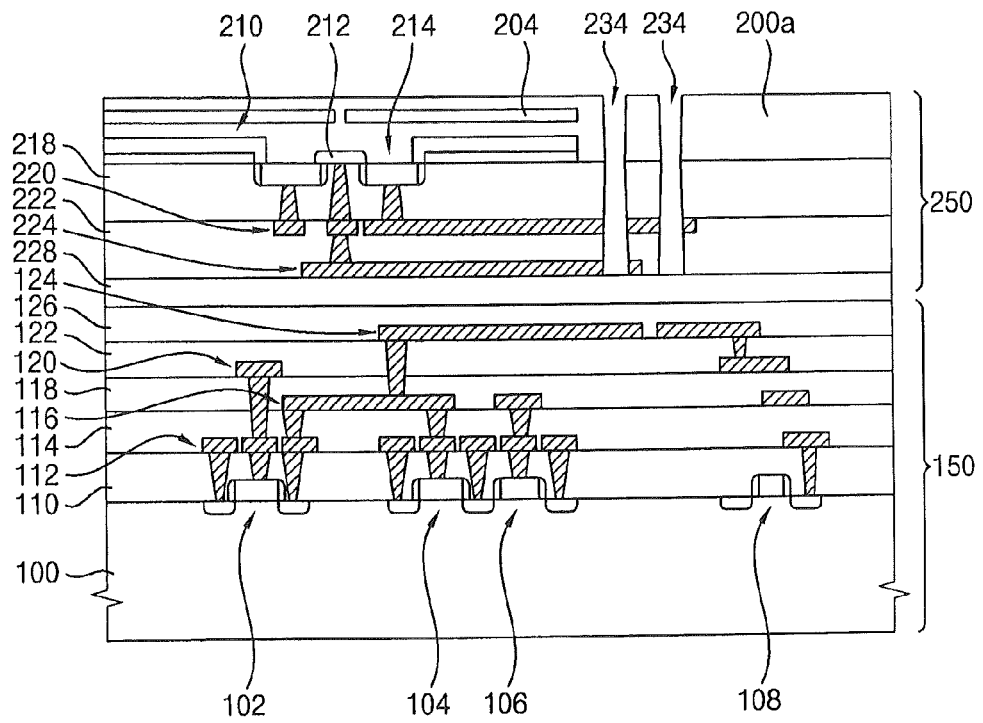

Referring to FIG. 18, the photo resist pattern 231 and the sacrificial plugs 230 are removed simultaneously by an ashing process. A third contact holes 234 being deeper than the second contact holes 232 may be formed when the sacrificial plugs 230 are removed.

As described above, the sacrificial plugs 230 may be removed without an additional etching process.

Figure 19:
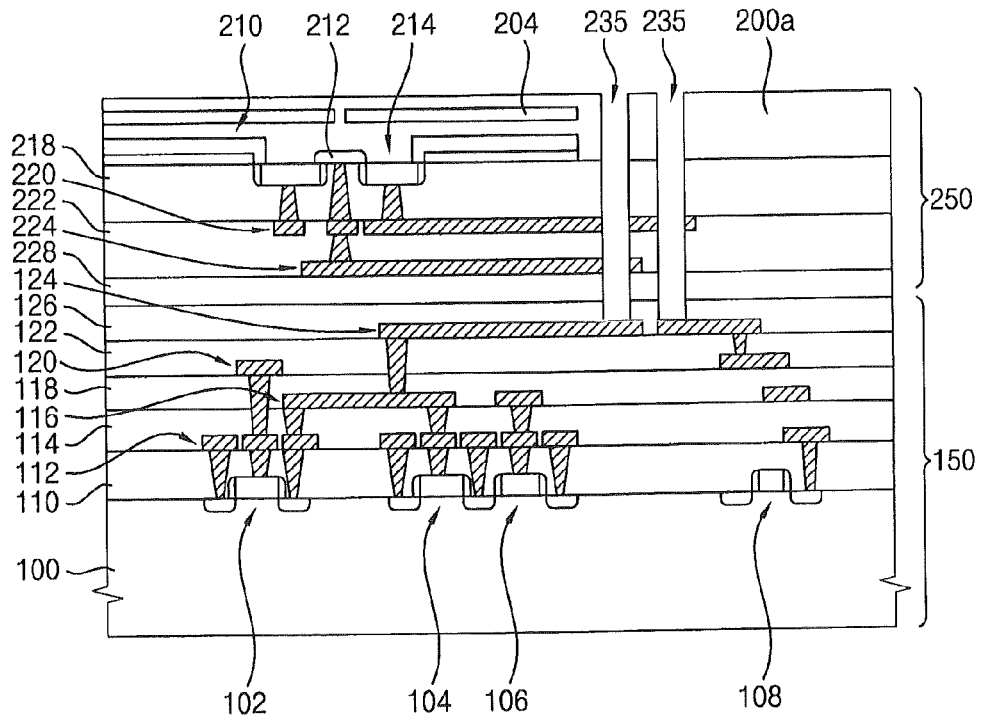

Referring to FIG. 19, fourth contact holes 235 are formed by etching portions of the sixth insulation layer 228 and the fifth insulation layer 126 exposed by the third contact holes 234. The fourth contact holes 235 may expose upper surfaces of the fourth wiring 124. The fourth contact holes 235 may penetrate the second substrate 200a, the eighth insulation layer 218, the seventh insulation layer 222, the sixth insulation layer 228 and the fifth insulation layer 126 from the second surface B of the second substrate 200a. At least one of the fifth wiring 224 and the sixth wiring 220 may be exposed on a sidewall of the fourth contact holes 235.

The fourth contact holes 235 may have a depth of about 10,000 Å to about 25,000 Å. As described above, the fourth contact holes 235 may be formed by two etching processes and one ashing process. An etched depth by one etching process may be only in a range of about 2,000 Å to about 6,000 Å. Therefore, the fourth contact holes 235 may be easily formed by the processes described above.

Figure 20:
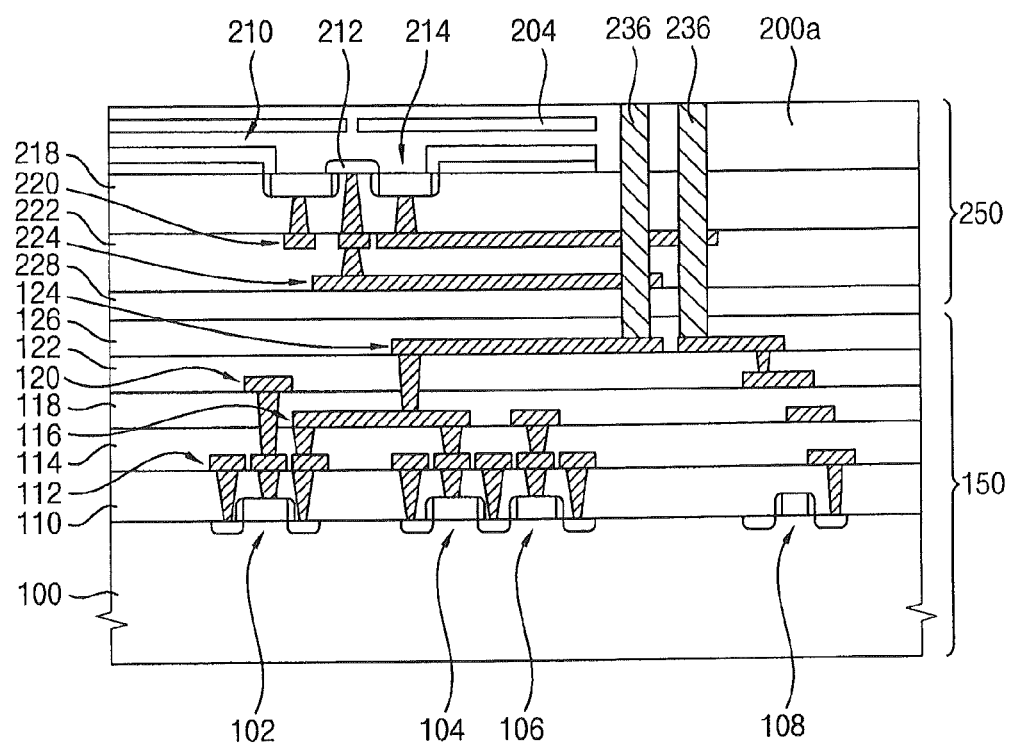
Figure 33:
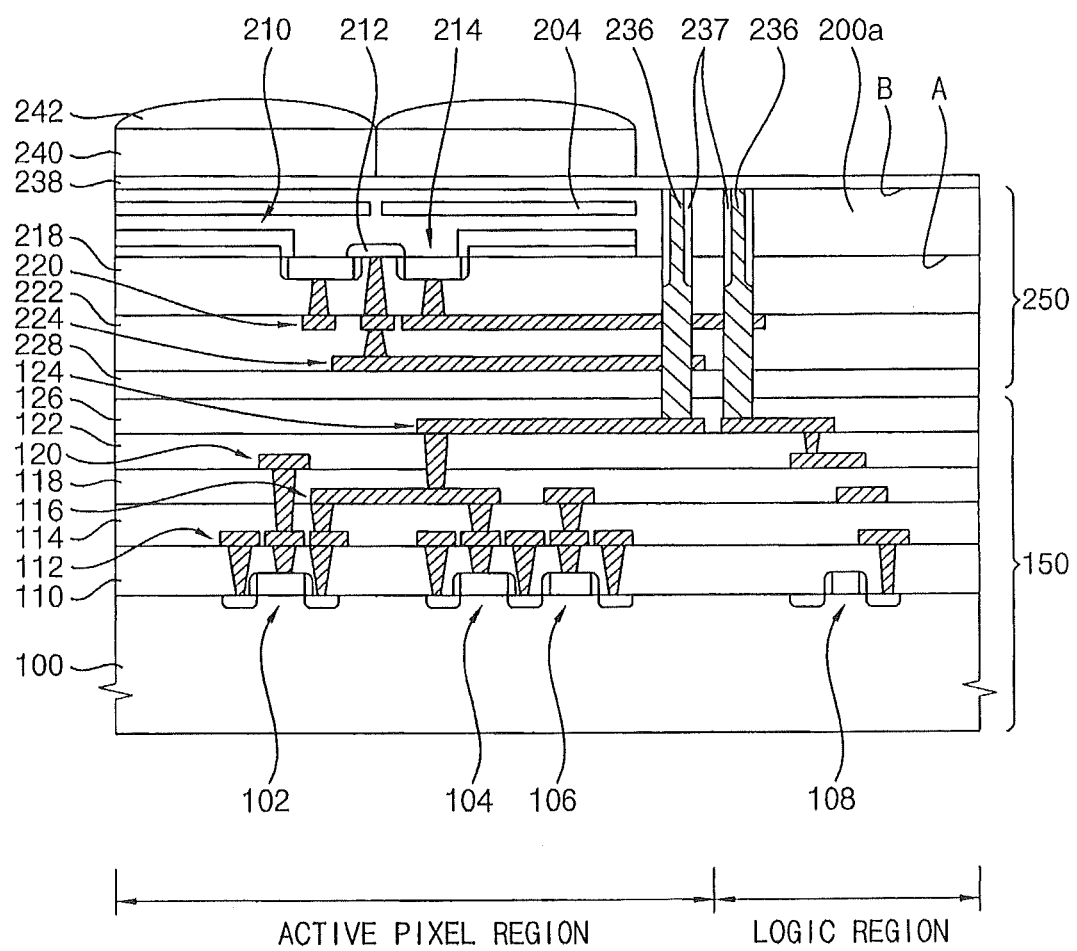
FIGS. 33 and 34 are cross-sectional views illustrating image sensors in accordance with further embodiments.

Referring to FIG. 20, an additional insulation layer 237 (FIG. 33) is formed on a sidewall of upper portions of the fourth contact holes 235. A conductive material may be deposited to fill up the fourth contact holes 235. The conductive material may be planarized to form the contact plugs 236. The conductive material may include metal and/or metal compound. Since the second substrate 200a is exposed on the sidewall of upper portions of the fourth contact holes 235, the additional insulation layer 237 may insulate the contact plugs 236 from the second substrate 200a.

The contact plugs 236 may penetrate the eighth insulation layer 218, the sixth wiring 220, the seventh insulation layer 222, the fifth wiring 224 and the sixth insulation layer 228 on the second substrate 200a, and penetrate the fifth insulation layer 126 on the first substrate 100. The contact plugs 236 may be electrically connected to the fourth wiring 124. Therefore, signals applied to the sixth wiring 220 and the fifth wiring 224 may be transferred to the fourth wiring 124 through the contact plugs 236.

Figure 21:
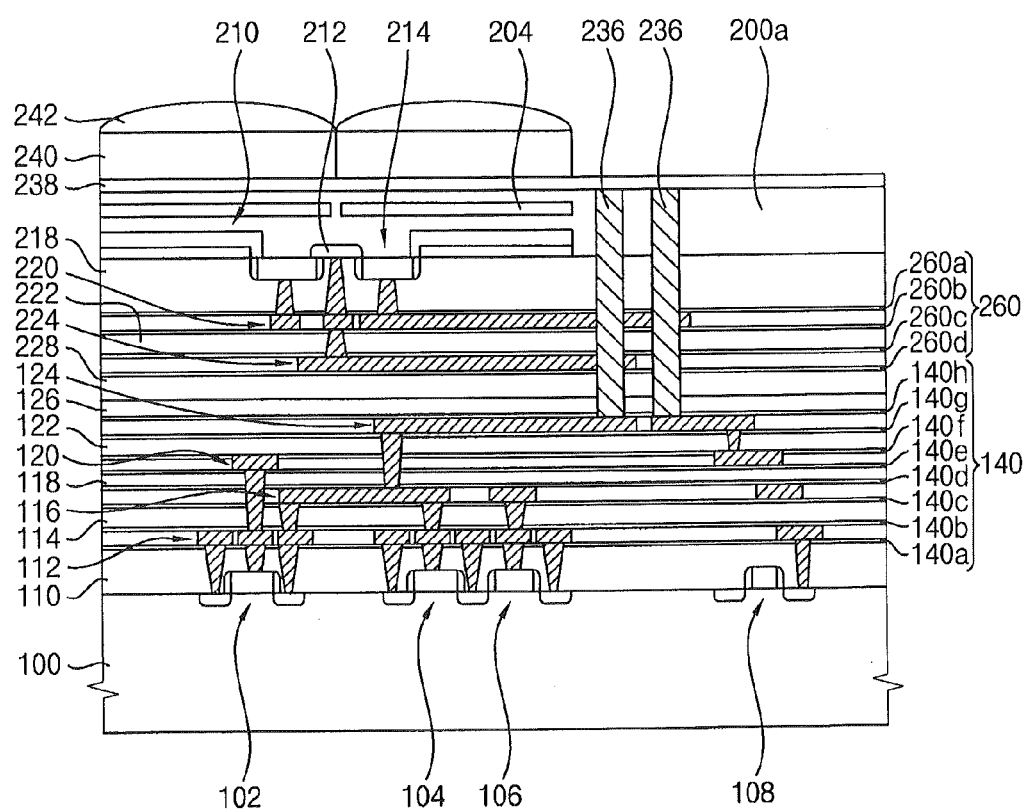
FIG. 21 is a cross-sectional view illustrating an image sensor in accordance with some embodiments.

FIG. 21 is a cross-sectional view of an image sensor in accordance with some embodiments.

The image sensor of FIG. 21 is similar to the image sensor of FIG. 3, except that etching stop layers are provided on upper surfaces and lower lateral surfaces of the wirings.

Referring to FIG. 21, a first substrate 100 may include a single crystalline material. For example, the first substrate 100 may include single crystalline silicon, single crystalline germanium, etc. A reset transistor 102, a driving transistor 104, a selection transistor 106 and a logic transistor 108 are provided on the first substrate 100. The transistors 102, 104, 106 and 108 may include a gate insulation layer, a gate electrode and impurity regions. A spacer may be provided on a sidewall of each gate electrode.

A first insulation layer 110, a second insulation layer 114, a third insulation layer 118, a fourth insulation layer 122 and a fifth insulation layer 126 covering the transistors 102, 103, 106 and 108 are sequentially disposed on the first substrate 100. A first wiring 112, a second wiring 116, a third wiring 120 and a fourth wiring 124 are formed through the first to the fifth insulation layers 110, 114, 118, 122 and 126, respectively. The first to the fourth wirings 112, 116, 120 and 124 may be electrically connected to the transistors 102, 104, 106 and 108 on the first substrate 100. Each of the first to the fourth wirings 112, 116, 120 and 124 includes a contact plug and a conductive pattern.

A photodiode 210, a transfer transistor 214 and a floating diffusion layer 212 are provided on a second substrate 200a. An eighth insulation layer 218, a seventh insulation layer 222 and a sixth insulation layer 228, which cover the photodiode 210, the transfer transistor 214 and the floating diffusion layer 212, are successively disposed under a first surface of the second substrate 200a. A sixth wiring 220 and a fifth wiring 224 are disposed through the eighth to the sixth insulation layers 218, 222 and 228 to be electrically connected to the transfer transistor 214 and the floating diffusion region 212. Each of the sixth and the fifth wirings 220 and 224 includes a contact plug and a conductive pattern.

The contact plugs and the conductive patterns included in the first to the sixth wirings 112, 116, 120, 124, 224 and 220 may include copper having a low resistance. When the first to the sixth wirings 112, 116, 120, 124, 224 and 220 are formed using copper having a low resistance, the first to the sixth wirings 112, 116, 120, 124, 224 and 220 may have relatively small widths and heights. Therefore, thicknesses of the first to the eighth insulation layers 110, 114, 118, 122, 126, 228, 222 and 218 may be reduced and a total height of the image sensor may also be reduced.

Etching stop layers 140 are provided on upper surfaces and lower lateral surfaces of the conductive patterns included in the first to the fourth wirings 112, 116, 120 and 124. Etching stop layers 260 are provided on upper surfaces and lower lateral surfaces of the conductive patterns included in the sixth and the fifth wirings 220 and 224. The etching stop layers 140 and the etching stop layers 260 formed on the upper surfaces of the conductive patterns may serve as diffusion barrier layers for preventing metal included in the conductive patterns from diffusing. As illustrated in FIG. 21, the etching stop layers 140 may be provided on each boundary surfaces between the first to the fifth insulation layers 110, 114, 118, 122 and 126, and the etching stop layers 260 may be provided on each boundary surfaces between the eighth to the sixth insulation layers 218, 222 and 228. The etching stop layers 140 and the etching stop layers 260 may include silicon nitride.

Similar to the image sensor of FIG. 3, the fifth insulation layer 126 on the first substrate 100 and the sixth insulation layer 228 on the second substrate 200a are adhered to each other. The fifth insulation layer 126 and the sixth insulation layer 228 may include silicon oxide. A contact plugs 236 may penetrate the eighth insulation layer 218, the sixth wiring 220, the seventh insulation layer 222, the fifth wiring 224 and the sixth insulation layer 228 on the second substrate 200a, and penetrate the fifth insulation layer 126 on the first substrate 100 to be electrically connected to the fourth wiring 124. An anti-reflective layer 238, a color filter 240 and a micro lens 242 are provided on a second surface of the second substrate 200a in which the second surface corresponds to the first surface.

In some embodiments, the image sensor may have a low height and a high performance since the first to the sixth wirings 112, 116, 120, 124, 224 and 220 are formed using copper having a low resistance. Additionally, since the first to the sixth wirings 112, 116, 120, 124, 224 and 220 are disposed below the photodiode 210, a light incident on the photodiode 210 may be not reduced although the etching stop layers 140 and 260, which are formed using silicon nitride having a lower light transmittance than silicon oxide, are formed on the first to the sixth wirings 112, 116, 120, 124, 224 and 220.

FIGS. 22 to 27 are cross-sectional views illustrating methods of manufacturing an image sensor in accordance with some embodiments.

The methods of manufacturing the image sensor of FIGS. 22 to 27 are similar to the methods of manufacturing the image sensor of FIGS. 5 to 20, except that wirings are formed by a damascene method.

Figure 22:
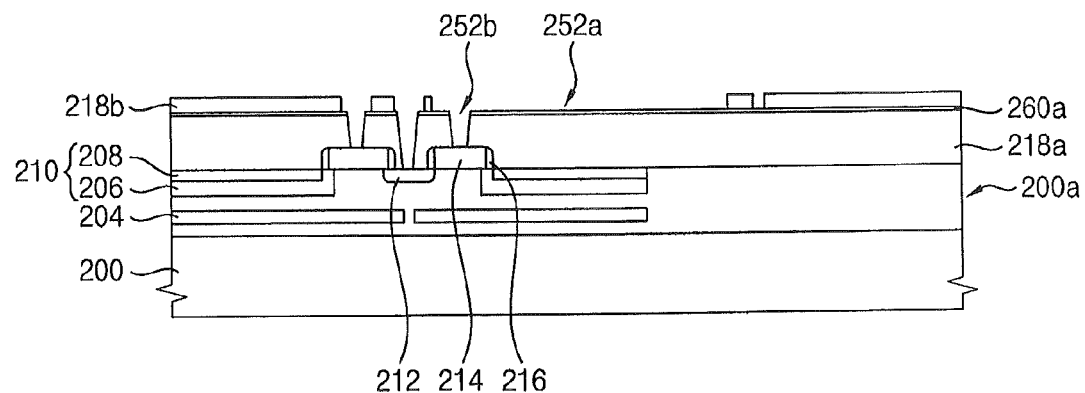
FIGS. 22 to 27 are cross-sectional views illustrating methods of manufacturing an image sensor in accordance with some embodiments.

Referring to FIG. 22, the photodiode 210, the transfer transistor 214 and the floating diffusion region 212 are formed on the second substrate 200 by the same processes as described with reference to FIG. 5.

A first lower insulation layer 218a covering the photodiode 210, the transfer transistor 214 and the floating diffusion region 212 is formed. An etching stop layer 260a is formed on the first lower insulation layer 218a. The etching stop layer 260a may include silicon nitride. A first upper insulation layer 218b is formed on the etching stop layer 260a.

First trenches 252a may be formed around a region where the first conductive pattern will be formed. The first trenches 252a may be formed by etching the first upper insulation layer 218b and the etching stop layer 260a. Regions of the first upper insulation layer 218b and the etching stop layer 260a where the contact plug 236 that penetrates the first conductive pattern will be formed are not removed during the process of forming the first trenches 252a. Fifth contact holes 252b may be formed by etching portions of the first lower insulation layer 218a under the first tranches 252a.

Figure 23:
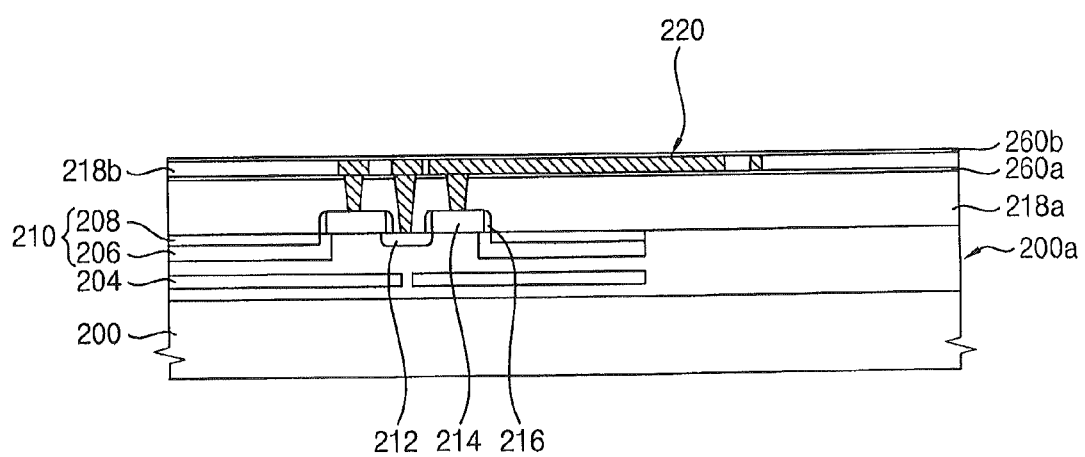

Referring to FIG. 23, a barrier metal layer (not illustrated) is formed on the first trenches 252a, the fifth contact holes 252b and the first upper insulation layer 218b. The barrier metal layer may include one of titanium, titanium nitride, tantalum, tantalum nitride, etc., or may be formed by accumulating more than two of titanium, titanium nitride, tantalum, tantalum nitride, etc. Metal may be deposited on the barrier metal layer to fill up the fifth contact holes 252b and the first trenches 252a. It is hard to pattern the metal by a photolithography process. For example, the metal may be copper.

After that, the barrier metal layer may be polished by a chemical mechanical polishing (CMP) process to expose the first upper insulation layer 218b for forming the sixth wiring 220.

An etching stop layer 260b is formed on the sixth wiring 220 and the first upper insulation layer 218b. The etching stop layer 260b may serve as a diffusion barrier layer for preventing metal included in the sixth wiring 220 from diffusing.

Figure 24:
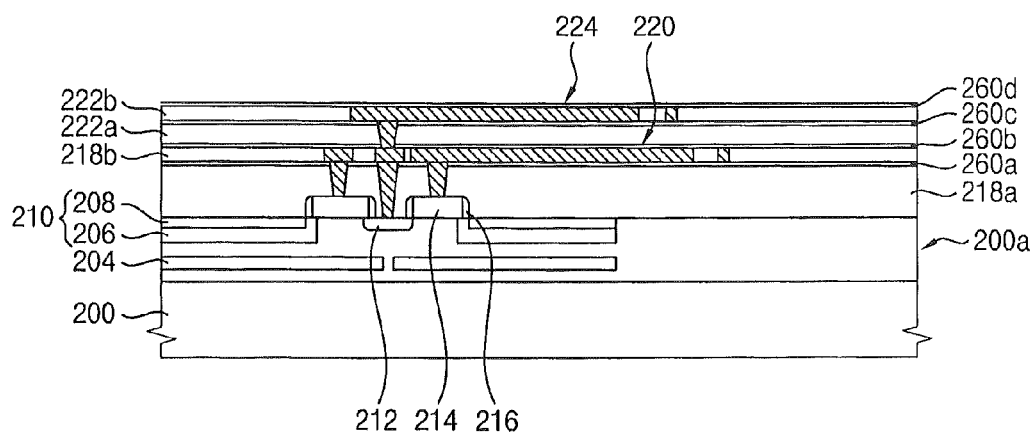

Referring to FIG. 24, a second lower insulation layer 222a, an etching stop layer 260c, a second upper insulation layer 222b and an etching stop layer 260d are sequentially formed by the same processes as described with reference to FIGS. 22 and 23. The fifth wiring 224 electrically connected to some of the sixth wiring 220 may be formed. Regions of the second upper insulation layer 222b and the etching stop layer 260c where the contact plug 236 will be formed are not removed during the process of forming the fifth wiring 224.

Figure 25:
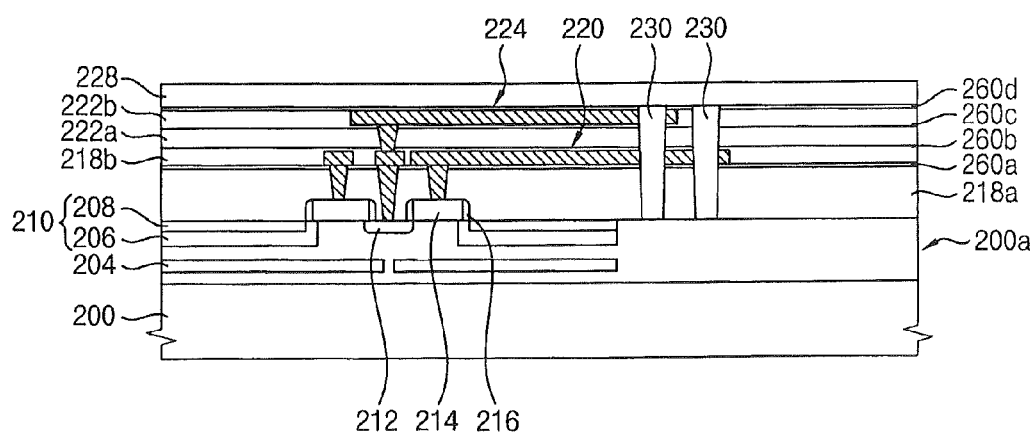

Referring to FIG. 25, contact holes are formed to expose the first surface of the second substrate 200 by etching the regions of the insulation layers and the etching stop layers where the contact plug 236 will be formed. After that, the sacrificial plugs 230 may be formed by depositing a sacrificial layer in the contact holes. The sixth insulation layer 228 may be formed on the sacrificial layer 230 and the etching stop layer 260d. The contact holes, the sacrificial plug 230 and the sixth insulation layer 228 may be formed by the same processes as described with reference to FIGS. 8, 9 and 10.

Figure 26:
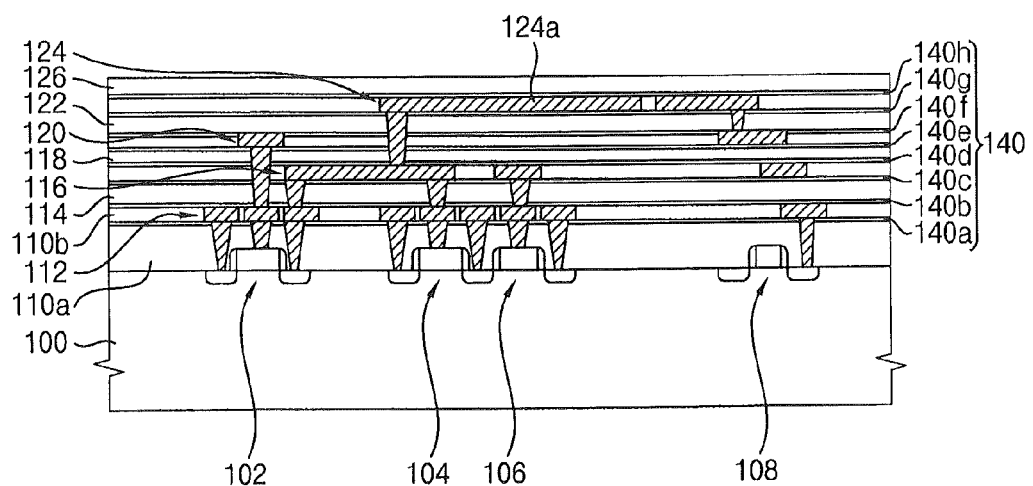

Referring to FIG. 26, the reset transistor 102, the driving transistor 104 and the selection transistor 106 are formed in the active pixel region of the first substrate 100 and the transistor 108 included in the logic circuits is formed in the logic region of the first substrate 100 by the same processes as described with reference to FIG. 11.

The third lower insulation layer 110a covering the transistors 102, 104, 106 and 108 on the first substrate 100 is formed. The etching stop layer 140a and the third upper insulation layer 110b are formed on the third lower insulation layer 110a.

Second trenches are formed at a region where the conductive pattern will be formed. The second trenches are formed by etching the third upper insulation layer 110b and the etching stop layer 140a. Sixth contact holes may be formed by etching portions of the third lower insulation layer 110a under the second trenches.

A barrier metal layer (not illustrated) is formed on the second trenches, the sixth contact holes and the third upper insulation layer 110b. Metal may be deposited on the barrier metal layer to fill up the sixth contact holes and the second trenches. It is hard to pattern the metal by a photolithography process. For example, the metal may be copper.

After that, the barrier metal layer may be polished by a chemical mechanical polishing (CMP) process to expose the third upper insulation layer 110b for forming the first wiring 112. An etching stop layer 140b is formed on the first wiring 112 and the third upper insulation layer 110b.

The insulation layers and the wirings are formed by repeatedly performing the same processes described above.

Figure 27:
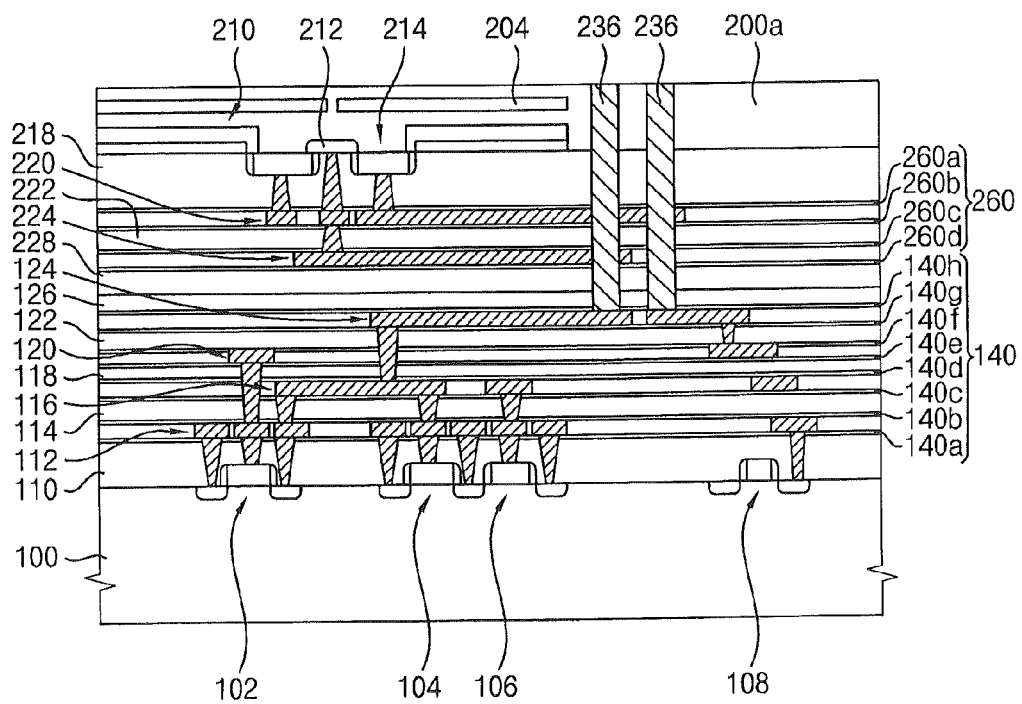

Referring to FIG. 27, the fifth insulation layer 126 on the first substrate 100 and the sixth insulation layer 228 on the second substrate 200 are adhered to each other by aligning, contacting and compressing the fifth insulation layer 126 and the sixth insulation layer 228, and performing a thermal treatment on two compressed insulation layers. At least a portion of the fourth wiring 124 on the first substrate 100 may correspond to the sacrificial plug 230 on the second substrate 200. The processes for adhering the first substrate 100 and the second substrate 200 to each other may be the same as the processes described with reference to FIG. 15.

After that, the second surface of the second substrate 200a may be polished, and the contact plugs 236 connected to the fourth wiring 124 may be formed. The processes described above may be the same as the processes described with reference to FIGS. 16 to 20.

As described above, highly integrated image sensor may be provided by adhering two substrates to each other. Any conductive materials are not exposed on the surfaces of the fifth insulation layer 126 and the sixth insulation layer 228. Only oxide such as silicon oxide is exposed on the surfaces of the fifth insulation layer 126 and the sixth insulation layer 228. Therefore, the first and the second substrates 100 and 200a may be adhered to each other firmly.

The present inventive concept may be applied to various circuits having two substrates adhered to each other. Hereinafter, a metal-oxide semiconductor (CMOS) transistor having two substrates adhered to each other will be described.

Figure 28:
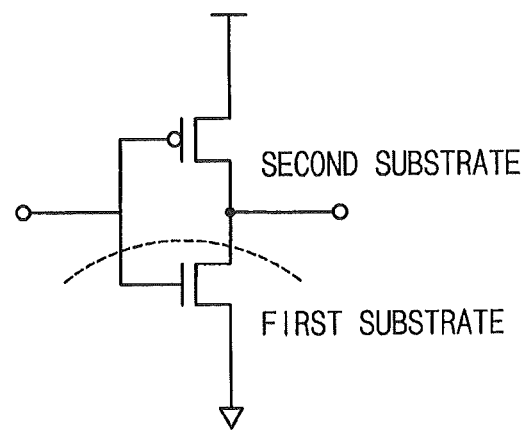
FIG. 28 is a circuit diagram illustrating an inverter including a CMOS transistor.
Figure 29:
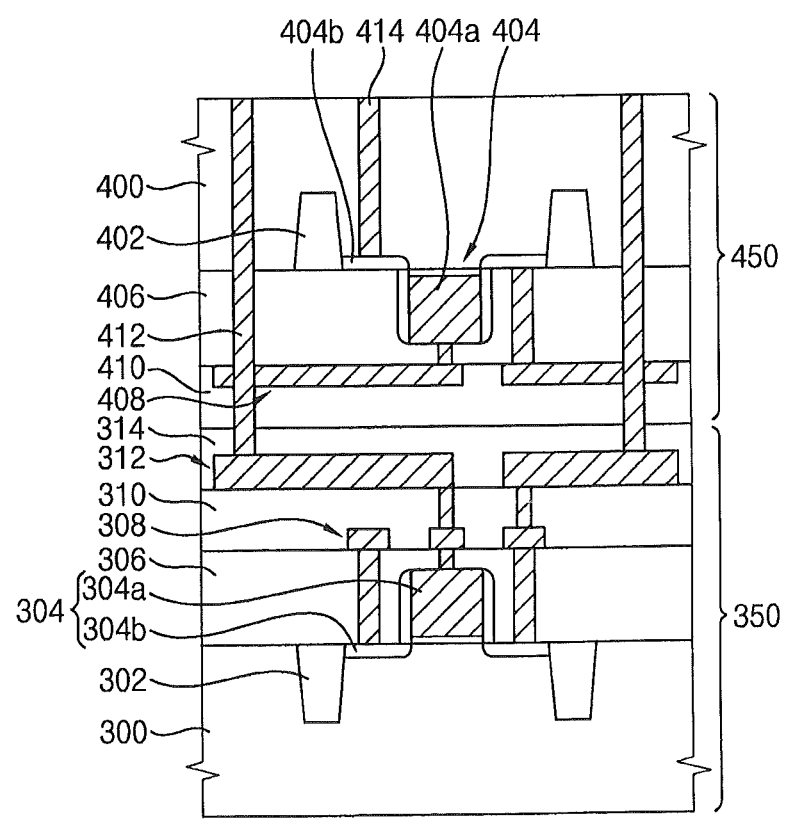
FIG. 29 is a cross-sectional view of an inverter including a CMOS transistor in accordance with some embodiments.

FIG. 28 is a circuit diagram illustrating an inverter including a CMOS transistor. FIG. 29 is a cross-sectional view of an inverter including a CMOS transistor in accordance with some embodiments.

In FIG. 29, a reference numeral 350 represents elements formed on a first substrate 300 and a reference numeral 450 represents elements formed on a second substrate 400.

Referring to FIG. 29, the first substrate 300 includes an active region and an isolation region separated by an isolation layer 302. An N-type metal-oxide semiconductor (NMOS) transistor 304 is formed in the active region of the first substrate 300. The NMOS transistor 304 may include a first gate 304a and N-type impurity regions 304b disposed beneath a surface of the first substrate 300 around both sides of the first gate 304a. A channel region of the NMOS transistor 304 may be doped with P-type impurities. That is, a region of the first substrate 300 under the first gate 304a may be doped with P-type impurities.

A first insulation layer 306 covering the NMOS transistor 304 is provided on the first substrate 300. First wirings 308 which penetrate the first insulation layer 306 and are electrically connected to electrodes of the NMOS transistor 304 are provided.

A second insulation layer 310 covering the first wirings 308 is provided on the first insulation layer 306. Second wirings 312 which penetrate the second insulation layer 310 and are electrically connected to the first wirings 308 are provided. The second wirings 312 will be directly connected to wirings formed on the second substrate 400. Therefore, the second wirings 312 may have a shape extending in a direction substantially parallel to the first substrate 300 to increase an align margin.

A third insulation layer 314 covering the second wirings 312 is provided on the second insulation layer 310. The third insulation layer 314 may be formed using a silicon oxide and have a level upper surface.

An isolation layer 402 is formed in the second substrate 400 from a first surface of the second substrate 400. A P-type metal-oxide semiconductor (PMOS) transistor 404 is formed on the first surface of the second substrate 400. The second substrate 400 may be formed using single crystal silicon. A thickness of the second substrate 400 may be in a range of about 2,000 Å to about 5,000 Å. The PMOS transistor 404 may include a second gate 404a and P-type impurity regions 404b disposed beneath the first surface of the second substrate 400 around both sides of the second gate 404a. The second gate 404a of the PMOS transistor 404 may protrudes downwardly (that is, toward the first substrate 300) from the first surface of the second substrate 400.

A fifth insulation layer 406 covering the PMOS transistor 404 is provided on the first surface of the second substrate 400. Third wirings 408 which penetrate the fifth insulation layer 406 and are electrically connected to electrodes of the PMOS transistor 404 are provided.

A fourth insulation layer 410 covering the third wirings 408 is provided on a lower surface of the fifth insulation layer 406. The fourth insulation layer 410 may have a level lower surface. The lower surface of the fourth insulation layer 410 may be adhered to the third insulation layer 314 on the first substrate 300.

First contact plugs 412 that penetrate the second substrate 400, the fifth insulation layer 406, the third wiring 408, the fourth insulation layer 410 and the third insulation layer 314 from a second surface of the second substrate 400 and are electrically connected to the second wirings 312 are provided in which the second surface corresponds to the first surface. An insulation material (not illustrated) is provided on boundary surfaces between sidewalls of upper portions of the first contact plugs 412 and the second substrate 400.

A second contact plug 414 that penetrates the second substrate 400 from the second surface of the second substrate 400 and is electrically connected to one of the impurity regions 404b of the PMOS transistor 404 may be provided. An insulation material (not illustrated) is provided on a boundary surface between sidewalls of the second contact plug 414 and the second substrate 400.

Figure 30:
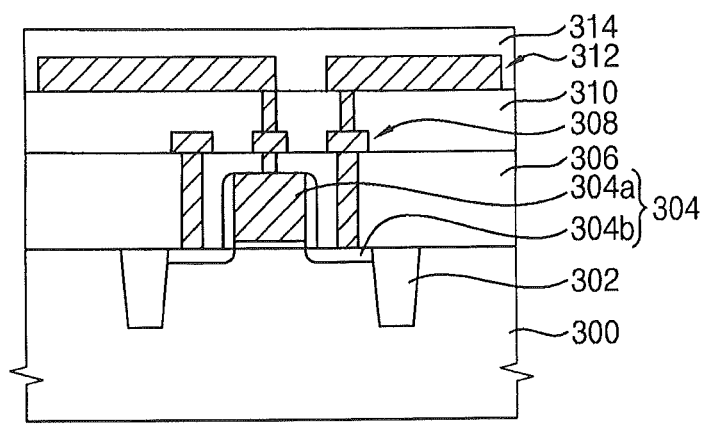
FIGS. 30 and 31 are cross-sectional views for describing methods of manufacturing a CMOS transistor of FIG. 29.
Figure 31:
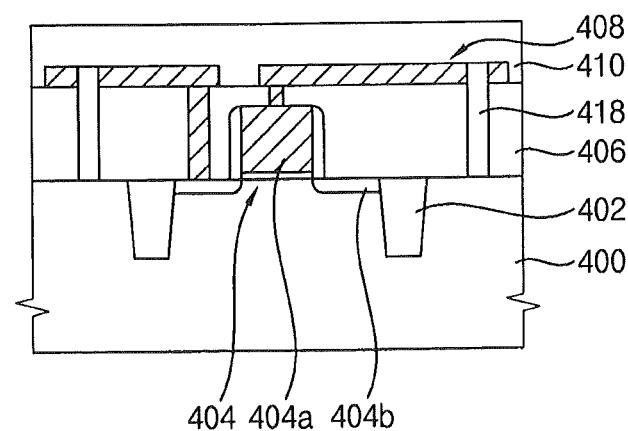

FIGS. 30 and 31 are cross-sectional views for describing methods of manufacturing a CMOS transistor of FIG. 29.

Referring to FIG. 30, the first substrate 300 includes the active region and the isolation region separated by an isolation process. The NMOS transistor 304 is formed on the first substrate 300.

The first insulation layer 306 covering the NMOS transistor 304 and the first substrate 300 is formed. The first wirings 308 which penetrate the first insulation layer 306 and are electrically connected to electrodes of the NMOS transistor 304 are formed.

The second insulation layer 310 covering the first wirings 308 is formed on the first insulation layer 306. Second wirings 312 which penetrate the second insulation layer 310 and are electrically connected to the first wirings 308 are formed. The second wirings 312 will be directly connected to wirings formed on the second substrate 400. Therefore, the second wirings 312 may have a shape extended in a horizontal plane to increase an align margin.

An insulation material may be deposited on the second insulation layer 310 to cover the second wirings 312. The insulation material may be planarized to expose an upper surface of the second wirings 312. The third insulation layer 314 having a level upper surface may be formed by depositing an insulation material again to cover the second wirings 312.

Referring to FIG. 31, the PMOS transistor 404 is formed on the first surface of the second substrate 400. The PMOS transistor 404 may include the second gate 404a and the P-type impurity regions 404b disposed beneath the first surface of the second substrate 400 around both sides of the second gate 404a.

The fifth insulation layer 406 covering the PMOS transistor 404 is provided on the first surface of the second substrate 400. The third wirings 408 which penetrate the fifth insulation layer 406 and are electrically connected to electrodes of the PMOS transistor 404 are formed.

First contact holes that penetrate conductive patterns included in the third wirings 408 and expose the first surface of the second substrate 400 may be formed by a photolithography process. Sacrificial plugs 418 may be formed in the first contact holes by depositing a sacrificial layer in the first contact holes and planarizing the sacrificial layer.

The fourth insulation layer 410 having a level upper surface is formed on the fifth insulation layer 406.

Referring again to FIG. 29, the third insulation layer 314 on the first substrate 300 and the fourth insulation layer 410 on the second substrate 400 may be adhered to each other. At least a portion of the second wiring 312 on the first substrate 300 may correspond to the sacrificial plug 418 on the second substrate 400. The third insulation layer 314 and the fourth insulation layer 410 may be adhered to each other by the processes described with reference to FIG. 15.

The second surface of the second substrate 400 may be removed by a polishing process. Second contact holes that expose the sacrificial plugs 418 may be formed by etching the second surface of the second substrate 400. Third contact holes may be formed by removing the sacrificial plugs 418 and then removing the fourth insulation layer 410 and the third insulation layer 314 disposed under the sacrificial plugs 418. Upper surfaces of the second wirings 312 on the first substrate 300 may be exposed by the third contact holes. An insulation layer (not illustrated) is formed on a sidewall of upper portions of the third contact hole. The first contact plugs 412 may be formed by depositing a conductive material in the third contact holes and polishing the conductive material.

A fourth contact hole may be formed in the second substrate 400 from the second surface of the second substrate 400. The second contact plug 414 that is electrically connected to one of the impurity regions 404b of the PMOS transistor 404 may be formed by depositing a conductive material in the fourth contact hole and polishing the conductive material.

As described above, a semiconductor device may be formed by adhering two substrates each of which has an insulation layer including silicon oxide as an adhered surface. The two substrates may be electrically connected by a contact plug.

Since the sacrificial plug, which is easily removed by an ashing process, may be formed in the second substrate, a deep contact plug having a depth more than about 5,000 Å may be easily formed. Since metal material may be not exposed on the adhered surface, the two substrates may be adhered to each other firmly.

Figure 32:
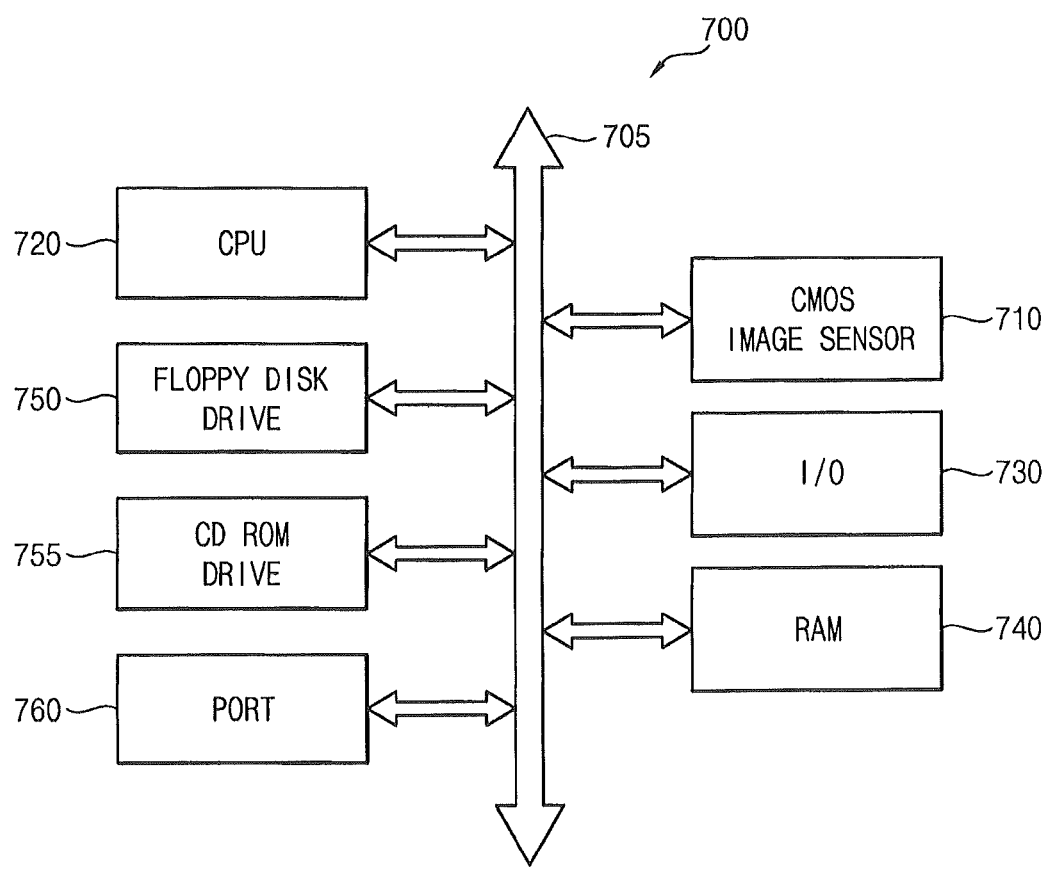
FIG. 32 is a block diagram illustrating a system including an image sensor in accordance with some embodiments.

FIG. 32 is a block diagram illustrating a system including an image sensor in accordance with some embodiments.

Referring to FIG. 32, a system 700 processes an output image generated from a CMOS image sensor 710.

The system 700 may be a computer system, a camera system, a scanner, a mechanized clock system, a navigation system, a video phone, a monitoring system, an auto focusing system, a chase system, a motion detection system, an image stabilization system, etc.

The system 700 includes a central process unit (CPU) 720, such as a microprocessor, that communicates with an I/O device 730 through a bus 705. The CMOS image sensor 710 may communicate with the CPU 720 through a bus 705. The system 700 may further include a memory RAM 740, a floppy disk drive 750, a CD ROM drive 755 and/or a port 760. The port 760 may couple the system with a video card, a sound card, a memory card, a universal serial bus (USB) device, etc. The port 760 may be a communication port with which the system 700 communicates with another system. The CMOS image sensor 710 may be integrated together with a CPU, a digital signal processor (DSP), a microprocessor, etc. A memory may be further integrated with the CMOS image sensor. The CMOS image sensor may be integrated in a chip that is different from a chip in which a processor is integrated.

As mentioned above, according to some embodiments, a highly integrated CMOS image sensor having a high performance may be provided. The CMOS image sensor may be used in a digital camera, a camcorder, a personal communication system (PCS), a medical micro camera, a robot, etc.

The foregoing is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims.

What is claimed is:

1. An image sensor comprising:
a first substrate including a logic circuit;
a first insulation layer on the first substrate and on the logic circuit;
a second substrate including a photoelectric conversion element;
a second insulation layer on the second substrate and on the photoelectric conversion element, wherein a lower surface of the second insulation layer is in direct physical contact with an upper surface of the first insulation layer;
a first conductive connector in a first via hole that extends through the first and second insulation layers; and
a second conductive connector in a second via hole that extends through the first and second insulation layers, wherein each of the first and second via holes are provided as a respective single continuous via hole which extends through both the first and second insulation layers;

wherein the first conductive connector is electrically connected to a first part of the photoelectric conversion element and the logic circuit and the second conductive connector is electrically connected to a second part of the photoelectric conversion element.

2. The image sensor of claim 1, wherein the photoelectric conversion element comprises a photodiode, a transfer transistor and a floating diffusion region.

3. The image sensor of claim 2, wherein a gate of the transfer transistor is electrically connected to the first conductive connector.

4. The image sensor of claim 2, wherein the floating diffusion region is electrically connected to the second conductive connector.

5. The image sensor of claim 4, wherein the first substrate further includes a driving transistor and a gate of the driving transistor is electrically connected to the second conductive connector.

6. The image sensor of claim 4, further comprising a first wiring pattern between the first substrate and the first insulation layer and a second wiring pattern between the second substrate and the second insulation layer, wherein the second wiring pattern is electrically connected to the floating diffusion region, and the first wiring pattern is electrically connected to the first conductive connector.

7. The image sensor of claim 1, wherein the first conductive connector and the second conductive connector extend into the second substrate.

8. The image sensor of claim 7, further comprising a third insulation layer configured to insulate the first conductive connector and the second conductive connector from the second substrate.

9. The image sensor of claim 1, wherein the second substrate has a thickness less than about 7000Å.

10. The image sensor of claim 1, wherein the first conductive connector is partially filled in the first via hole and an insulation material is deposited in the first via hole above the first conductive connector to be extended into the second substrate, and
wherein the second conductive connector is partially filled in the second via hole and an insulation material is deposited in the second via hole above the second conductive connector to be extended into the second substrate.

11. The image sensor of claim 1, wherein the photoelectric conversion element comprises a floating diffusion region, a first photodiode, a first transfer transistor, a second photodiode and a second transfer transistor, wherein the floating diffusion region is coupled to the first transfer transistor and the second transfer transistor.

12. The image sensor of claim 1, wherein the logic circuit includes at least one of a timing generator, a row decoder, a row driver, a correlated double sampler (CDS), an analog to digital converter (ADC), a latch unit and a column decoder.

13. The image sensor of claim 1, further comprising a layer under the second substrate, the layer including at least one of silicon nitride, silicon oxynitride, tantalum oxide, titanium oxide and hafnium oxide.

14. The image sensor of claim 13, wherein the layer prevents an incident light from reflecting on a surface of the second substrate.

15. The image sensor of claim 13, wherein the layer has thickness in a range of several tens of angstroms up to several hundreds of angstroms.

16. The image sensor of claim 1, wherein the second substrate has a front surface and a back surface, and
wherein the photoelectric conversion element receives an incident light passing through the back surface of the second substrate, and the second insulation layer disposes above the front surface of the second substrate.

* * * * *